United States Patent [19]
Collins

[11] Patent Number: 5,506,521
[45] Date of Patent: Apr. 9, 1996

[54] ECL DRIVER WITH ADJUSTABLE RISE AND FALL TIMES, AND METHOD THEREFOR

[75] Inventor: David F. Collins, Harmonyville, Pa.

[73] Assignee: Unisys Corporation, Blue Bell, Pa.

[21] Appl. No.: 259,601

[22] Filed: Jun. 13, 1994

Related U.S. Application Data

[63] Continuation-in-part of Ser. No. 924,561, Aug. 3, 1992, Pat. No. 5,321,320.

[51] Int. Cl.$^6$ .................................................. H03K 19/20
[52] U.S. Cl. ............................ 326/126; 326/129; 326/89
[58] Field of Search ....................... 326/89, 92, 124–129

[56] References Cited

U.S. PATENT DOCUMENTS

| | | | |
|---|---|---|---|
| 4,559,458 | 12/1985 | Ma | 326/126 |
| 4,626,709 | 12/1986 | Mazumder | 326/126 |
| 4,906,869 | 3/1990 | Masuoka | 326/126 |
| 5,089,721 | 2/1992 | Lulch | 326/26 |
| 5,146,116 | 9/1992 | Sugimoto | 326/126 |
| 5,298,802 | 3/1994 | Usami | 326/126 |
| 5,321,320 | 6/1994 | Collins | 326/126 |

*Primary Examiner*—Edward P. Westin
*Assistant Examiner*—Andrew Sanders
*Attorney, Agent, or Firm*—Robert R. Axenfeld; Mark T. Starr

[57] ABSTRACT

A series-gated ECL driver, such as a series-gated ECL cut-off driver, is provided with settable output rise time and settable output fall time, in order to reduce noise at the output of the driver while limiting the delay resulting from such noise reduction. A method is also provided for so controlling an ECL driver. The driver includes at least two current switches fed by a current source. Each current switch includes a NOR side including one or more transistors, and an OR side including one or more transistors. The input to the NOR side of one such current switch can be buffered with an input emitter follower, and the output from that current switch can be buffered with an output emitter follower. A capacitance is connected across the one current switch and the current source, that is between the collector(s) and emitter(s) of the NOR side transistor(s) of that current switch, and the input side of the current source. Another capacitance is connected at one electrode both to the collector(s) of the OR side transistor(s) of that current switch and to the base(s) of the output emitter follower transistor(s). In one embodiment, the remaining side of the other capacitance is connected to ground and to the collector(s) of the output emitter follower transistor(s). In another embodiment, the other side of the other capacitance is connected to the collector(s) of the NOR side transistor(s) of that current switch. In still another embodiment, the other side of the other capacitance is connected to the current source and to the emitter(s) of the NOR side transistor(s) and the OR side transistor(s) of another of the at least two current switches.

18 Claims, 22 Drawing Sheets

ECL DRIVER WITH ADJUSTABLE RISE AND FALL TIMES, AND METHOD THEREFOR

CROSS-REFERENCE TO RELATED APPLICATION

This is a continuation-in-part of application Ser. No. 07/924,561, filed Aug. 3, 1992 now U.S. Pat. No. 5,321,320, Jun. 14, 1994.

FIELD OF THE INVENTION

The present invention relates to electronic drivers, and more particularly to electronic drivers having adjustable rise and fall times.

BACKGROUND OF THE INVENTION

ECL (emitter - coupled logic) drivers have been used as output buffers and drivers. Although such devices have served the purpose, they have not proven entirely satisfactory under all conditions of service because they produce short (on the order of 0.5 nanosecond) transition (rise and fall) times. Such short transition times, for example for a driver resident on a printed circuit board, can create reflections in the conductive line(s) leading from the output of such a driver. These lines can appear on printed circuit boards, backplanes, cabling, etc. Such reflections produce noise in those lines. Such reflections can occur anywhere on the conductive line(s) connected to the output of the driver. Such reflections can occur anywhere on such lines(s) from the output of the driver to the end(s) of the line(s). For example, a sufficiently fast transition time can cause a signal reflection at a downstream receiver, which reflection would be returned to the driver output, producing unwanted noise.

Present ECL technology provides output driver transition times (rise and fall times) in the sub-nanosecond range. In certain applications and designs, it is advantageous to purposely slow down these transition times in order to minimize noise.

One response to this problem has been to slow down the driver transition times in the manner shown in prior art FIG. 1. FIG. 1 shows an ECL cutoff driver 10 wherein the input signal IN to the driver is provided to the emitter follower 12 formed by transistor TI and resistor RI. Driver 10 further includes a current switch 14, current source 16 and output emitter follower (OEF) or output buffer 18. Current switch 14 includes a NOR switch or NOR side 20 and an OR switch or OR side 22. The transistors of current source 16 are biased up by reference voltage $V_{ref\ 2}$ so that current source 16 serves as a constant current generator, so voltage $V_{EE}$ pulls constant current through either side 20 or 22 of current switch 14. Input signal IN and reference voltage $V_{ref\ 1}$ determine which side 20 or 22 of current switch 14 is to be turned "on"; both sides of switch 14 are "on" only during transitions. Current switch 14 is provided with a load or "swing" resistor 24. Capacitor 26 is placed between the base and collector of OEF 18, and thus across current switch 14 load resistor 24. Capacitor 26 is placed across load resistor 24 to slow down the driver 10 transition times. This technique is operable, but has a disadvantage in that the resulting output rise time TR is approximately 1.5 times the resulting fall time TF, thus causing the propagation delay TD++ (propagation delay when driver 10 input and output are both going positive) to increase more than the increase in fall time, thus resulting in slower circuit performance. This substantial increase in TD++ when attempting to adjust the fall time TF of the driver is therefore undesirable.

ECL drivers can be categorized as cutoff drivers and non-cutoff ("normal") drivers. Operation of cutoff and non-cutoff drivers is distinguished by low-state output voltage level $V_{OL}$ and by operation of the OEF in the driver's low state. For a cutoff driver, $V_{OL}=V_{TT}$ (terminating voltage) which can be accomplished by turning off (cutoff of) the OEF transistor(s). For a non-cutoff driver, $V_{OL}$ is higher, and the OEF is not cutoff. Cutoff drivers and non-cutoff drivers can have the same schematic diagrams or component interconnections, but have some different component and operating (voltage or current) values.

As shown in FIG. 1, a present method used to slow down the fall time of an ECL cutoff driver is to place a capacitor 26 across the swing or load resistor 24 in current switch 14. This then provides a time constant of R (resistance of load resistor 24) times C (capacitance of capacitor 26) which causes the base voltage of output emitter follower 18 to rise and fall exponentially. The effect of this at the emitter of OEF 18 is that the resulting rise time is approximately 1.5 times greater than the resulting fall time, causing the TD++ propagation delay to increase essentially the same amount as the increase in rise time. This disproportionate increase in rise time versus fall time results because during the rise time, the base of OEF 18 must rise to a voltage sufficient to turn the OEF on, and during rise time the rate of change of the base voltage, being exponential, has diminished. The opposite is true during the fall time; during the fall time, the emitter of OEF 18 responds during the greatest rate of change of the OEF base voltage. These transition times are illustrated in prior art FIG. 2.

In the device of FIG. 1, resistor 24 can for example be 290 ohms, resistor RE can for example be 97 ohms, resistor RI can for example be 13K ohms, resistor RO can for example be 25 ohms, current source 16 can for example be configured to produce 4.5 milliamperes, capacitor 26 can for example be 6 picofarads, reference voltage $V_{ref\ 1}$ can for example be −2.157 reference volts, voltage $V_{ref\ 2}$ can for example be −3.879 volts, voltage $V_{EE}$ can for example be −5.2 volts, and load termination voltage or terminating voltage $V_{TT}$ can for example be −2.0 volts.

Results of a simulation of the driver of FIG. 1, using SPICE (Simulation Program with Integrated Circuit Emphasis) integrated circuit simulation software, is given in FIG. 2, and in Table 0 below. For that simulation, "swing" resistor 24 was set to 290 ohms, current source 16 produced a constant current of 4.5 milliamperes, driver output rise time TR and driver output fall time TF were measured from 20% to 80%, propagation delay TD++ (defined above) and propagation delay TD—— (propagation delay when driver 10 input and output are both going negative) were measured from 50% of the driver input to −1.3 V on the output, time is shown in the last four columns in nanoseconds, and the first column shows different values of capacitor 26. Voltages, RE, RI and RO were set as described in the preceding paragraph. A suitable pulse input, and a suitable simulated load at the output, were used for the simulation. SPICE is discussed in Antognetti, P. and Massobrio, G., eds. *Semiconductor Device Modeling with SPICE* (McGraw-Hill, New York, 1988).

TABLE 0

| C(pF) | TR(ns) | TF(ns) | TD++(ns) | TD——(ns) |
|---|---|---|---|---|
| 0 | 0.74 | 0.61 | 1.07 | 0.73 |
| 1.0 | 0.94 | 0.71 | 1.36 | 0.80 |
| 2.0 | 1.21 | 0.88 | 1.67 | 0.92 |
| 3.0 | 1.52 | 1.07 | 1.99 | 1.02 |

TABLE 0-continued

| C(pF) | TR(ns) | TF(ns) | TD++(ns) | TD—(ns) |
|-------|--------|--------|----------|---------|
| 4.0   | 1.84   | 1.27   | 2.31     | 1.12    |
| 5.0   | 2.19   | 1.50   | 2.64     | 1.21    |
| 6.0   | 2.54   | 1.73   | 2.98     | 1.30    |

The above data is for an ECL cutoff driver that is also a non-series gated ECL driver. For an ECL non-cutoff driver, resistor 24 could for example be 330 ohms, and current source 16 could for example be configured to produce 3.0 milliamperes.

Thus, a prior art approach to slowing down output rise time and output fall time for ECL drivers causes a disproportionately larger increase in output rise time compared with output fall time, so that any resulting noise reduction is obtained with an undesirable increase in delay. In this prior art approach, output rise time is slowed more than is output fall time. Thus, to sufficiently increase output fall time for effective noise reduction, an additional increase in output rise time is required, beyond what would be necessary for effective noise reduction for rising transitions. It is therefore also desirable to at least substantially independently control rise time and fall time, in order to reduce noise while limiting the delay resulting from that noise reduction.

It can also be desirable, for similar reasons, to control output rise time and output fall time for multi-level or series-gated ECL circuits, as well as non-series gated ECL circuits. A series gated ECL circuit utilizes multi-level (series) gating. A non-series gated ECL driver such as that of FIG. 1 is the simplest form of an ECL circuit in that it has one current switch and one current source. Series-gated designs are more complex and provide for a greater logic implementation. A series-gated ECL gate has more than one current switch, but those current switches of the ECL gate are served by what in effect is only one current source. One can think of series gating as multiple current switches arranged vertically in a series connection and "fed" by a single current source. In the past, a series-gated ECL driver has been provided which includes a capacitor 26 of FIG. 1 connected across its load or "swing" resistor, and which has shortcomings similar to those described above for driver 10.

SUMMARY OF THE INVENTION

Accordingly, the general purpose of the present invention is to provide apparatus and method for controlling rise and fall times for the output of an ECL driver, whether series-gated or not series-gated.

Other objects of the present invention are to provide apparatus and method for reducing reflections and noise at the output of an ECL driver while limiting the delay resulting from such noise reduction.

A further object of the present invention is to provide apparatus and method for adjustable controlling of the rise and fall times of the output of an ECL driver at least substantially independently of each other.

Still another object of the present invention is to provide apparatus and method for making the rise time and fall time of the output of an ECL driver at least substantially equal.

Another object of the present invention is to provide apparatus and method for delaying the rise time and the fall time of the output of an ECL driver while making them at least substantially equal.

Yet another object of the present invention is to provide an ECL driver having at least substantially separately adjustable output rise time and output fall time, thereby reducing any noise caused by the output edge rates or transition times while limiting or reducing the delay caused by such noise reduction.

A still further object of the present invention is to provide apparatus and method for controlling rise and fall times for the output of a series-gated ECL driver.

Still other objects of the present invention are to provide apparatus and method for reducing reflections and noise at the output of a series-gated ECL driver while limiting the delay resulting from such noise reduction.

Yet another object of the present invention is to provide apparatus and method for adjustable controlling of the rise and fall times of the output of a series-gated ECL driver at least substantially independently of each other.

A still further object of the present invention is to provide apparatus and method for making the rise time and fall time of the output of a series-gated ECL driver at least substantially equal.

Still another object of the present invention is to provide apparatus and method for delaying the rise time and the fall time of the output of a series-gated ECL driver while making them at least substantially equal.

Yet another object of the present invention is to provide a series-gated ECL driver having at least substantially separately adjustable output rise time and output fall time, thereby reducing any noise caused by the output edge rates or transition times while limiting or reducing the delay caused by such noise reduction.

Briefly, these and other objects of the present invention are accomplished by adding at least two capacitors to the ECL driver. The driver includes a current switch, with a current source connected to the current switch. The current switch includes a NOR side or NOR switch including one or more transistors, and an OR side or OR switch including one or more transistors. The input to the NOR side can be buffered with an input emitter follower, and the output from the current switch can be buffered with an output emitter follower, each of which can include one or more transistors. In a preferred embodiment, one such capacitor is connected across the collector(s) and emitter(s) of the NOR side transistor(s), while the other capacitor is connected across the base(s) and collector(s) of the output emitter follower (OEF) or output buffer transistor(s). In another embodiment, one such capacitor is connected across the collector(s) and emitter(s) of the NOR side transistor(s), while the second capacitor is connected between the collector(s) of the NOR side transistor(s) and the base(s) of the OEF transistor(s). In yet another embodiment, one such capacitor is connected across the collector(s) and emitter(s) of the NOR side transistor(s), while a second capacitor is connected between the emitter(s) of the OR side transistor(s), and the collector(s) of the OR side transistor(s) and the base(s) of the OEF transistor(s).

In each case, one capacitor is connected across the collector(s) and emitter(s) of the NOR side transistor(s) of the driver, while another capacitor is connected to the base(s) of the OEF transistor(s) (if any) and at the same electrode to the collector(s) of the OR side transistor(s) of the driver. The first capacitor is also connected to the current source. In one embodiment, the other side of the second capacitor is connected to the collector(s) of the OEF transistor(s) (if any) and to the other side of the current source. In a second embodiment, the other side of the second capacitor is connected to the collector(s) of the NOR side transistor(s). In a third embodiment, the second capacitor is also connected to the emitter(s) of the OR side transistor(s), and to the current source.

For a series-gated ECL driver, these and other objects of the present invention are accomplished by adding at least two capacitors to such a driver. The driver includes at least two current switches, with a current source connected to all such current switches. Each such current switch includes a NOR side or NOR switch including one or more transistors, and an OR side or OR switch including one or more transistors. For each current switch, the input to the NOR side can be buffered with an input emitter follower, and the output from each current switch can be buffered with an output emitter follower, each of which can include one or more transistors. Of the at least two capacitors added to the series-gated ECL driver, one such capacitor is connected at one side to one side of the current source and to the emitter(s) of the NOR side transistor(s) of one current switch connected directly to the current source, and at its other side to the collector(s) of the NOR side transistor(s) of another, second current switch of the series-gated ECL driver. Another of the at least two capacitors is connected at one side to the base(s) of the OEF transistor(s) (if any) and to the collector(s) of the OR side transistor(s) of the second current switch. In one embodiment, the other side of the second capacitor is connected to the collector(s) of the OEF transistor(s) (if any) and to the other side of the current source. In a second embodiment, the other side of the second capacitor is connected to the collector(s) of the NOR side transistor(s). In a third embodiment, the other side of the second capacitor is connected to the first side of the current source and to the emitter(s) of the transistor(s) of either or both of the NOR and OR sides of the first current switch.

Other objects, advantages and novel features of the invention will become apparent from the following detailed description of the invention when considered in conjunction with the accompanying drawings.

DESCRIPTION OF THE PREFERRED EMBODIMENTS

Figure 3:
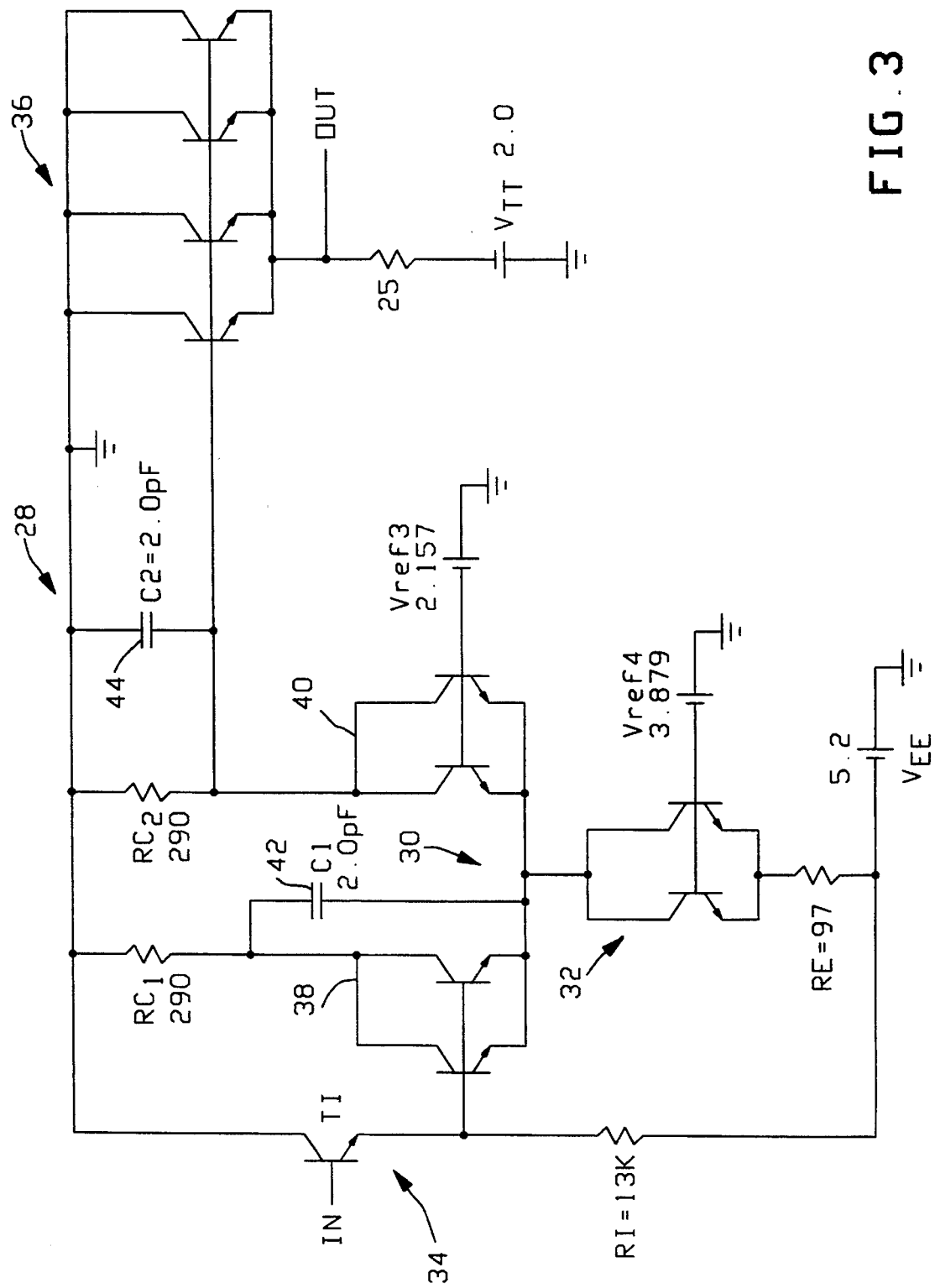
FIG. 3 is a schematic diagram of one embodiment of an ECL driver according to the present invention.

Referring now to the drawings, wherein like reference characters designate like or corresponding parts throughout the several views, there is shown in FIG. 3 an ECL cutoff driver 28 according to the present invention including a current switch 30 and a current source 32. Driver 28 can, if desired, also include an emitter follower 34 serving as an input buffer, and an emitter follower 36 serving as an output buffer. Input signal IN is applied to the input of input emitter follower 34 (that is, the base electrode of the transistor of emitter follower 34) and, as buffered thereby, is provided to NOR side 38 of current switch 30. Current switch 30 includes a NOR switch or NOR side 38 and an OR switch or OR side 40. In the absence of emitter follower 34, input signal IN would be applied directly to the base(s) of the transistor(s) of the NOR side 38 of current switch 30. The transistors of current source 32 are biased up by reference voltage $V_{ref\,4}$ so that current source 32 serves as a constant current generator, so voltage $V_{EE}$ pulls constant current through either side 38 or 40 of current switch 30. Input signal IN and reference voltage $V_{ref\,3}$ determine which side 38 or 40 of current switch 30 is to be turned "on"; both sides are "on" only during transitions. Each side 38 and 40 of current switch 30 is provided with a respective load or "swing" resistor $RC_1$ and $RC_2$.

Figure 4:
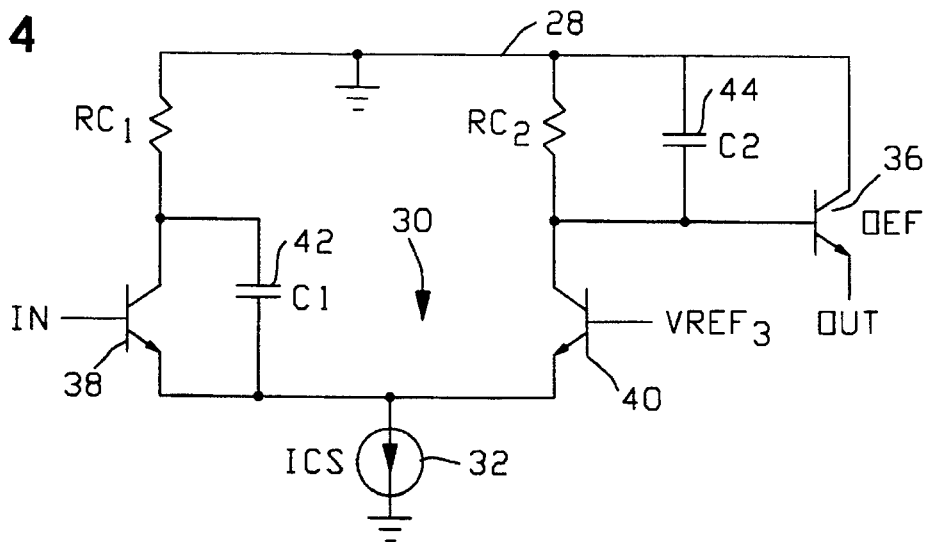
FIG. 4 is a simplified schematic diagram of the driver of FIG. 3.

Driver 28 further includes capacitors 42 and 44, respectively also identified in FIGS. 3 and 4 as C1 and C2. Capacitor 42 is placed across the output of NOR side 38, that is across the collector(s) and emitter(s) of the NOR side 38 transistor(s) of current switch 30. Capacitor 44 is placed across load resistor $RC_2$, and so is also connected across the collector(s) and base(s) of the transistor(s) of output emitter follower 36, and is connected between ground and the collector(s) of the OR side 40 transistor(s) of current switch 30. Capacitors 42 and 44 slow down driver 28. FIG. 4 is a more simplified schematic diagram of the driver 28 of FIG. 3.

The configuration of FIG. 3 was simulated using the simulation program SPICE (Simulation Program with Integrated Circuit Emphasis), discussed above. The results of the simulation are shown in Table 1 below, wherein C1 is capacitor 42, C2 is capacitor 44, TR is rise time, TF is fall time, TD++ is the propagation delay when the driver 28 input and output are both going positive, and TD— is the propagation delay when the driver 28 input and output are both going negative. A suitable pulse input, and a suitable load at the output, were used for the simulation.

TABLE 1

| C1(pF) | C2(pF) | TR(ns) | TF(ns) | TD++(ns) | TD—(ns) |
|---|---|---|---|---|---|
| 1.00 | 1.00 | 0.94 | 0.87 | 1.43 | 1.01 |
| 2.00 | 2.00 | 1.21 | 1.24 | 1.76 | 1.32 |
| 4.00 | 4.00 | 1.84 | 2.11 | 2.44 | 1.97 |
| 6.00 | 6.00 | 2.54 | 3.02 | 3.13 | 2.64 |
| 0.00 | 3.00 | 1.51 | 1.09 | 2.01 | 1.12 |
| 2.00 | 3.00 | 1.51 | 1.43 | 2.08 | 1.44 |
| 2.64 | 3.00 | 1.51 | 1.58 | 2.09 | 1.57 |
| 3.00 | 3.00 | 1.51 | 1.67 | 2.10 | 1.64 |
| 4.00 | 3.00 | 1.51 | 1.91 | 2.11 | 1.83 |
| 2.64 | 0.00 | 0.74 | 1.08 | 1.15 | 1.08 |
| 2.64 | 1.00 | 0.94 | 1.21 | 1.46 | 1.27 |
| 2.64 | 2.00 | 1.21 | 1.39 | 1.78 | 1.43 |
| 2.64 | 3.00 | 1.51 | 1.58 | 2.10 | 1.57 |
| 2.64 | 4.00 | 1.84 | 1.78 | 2.42 | 1.69 |

Figure 5:
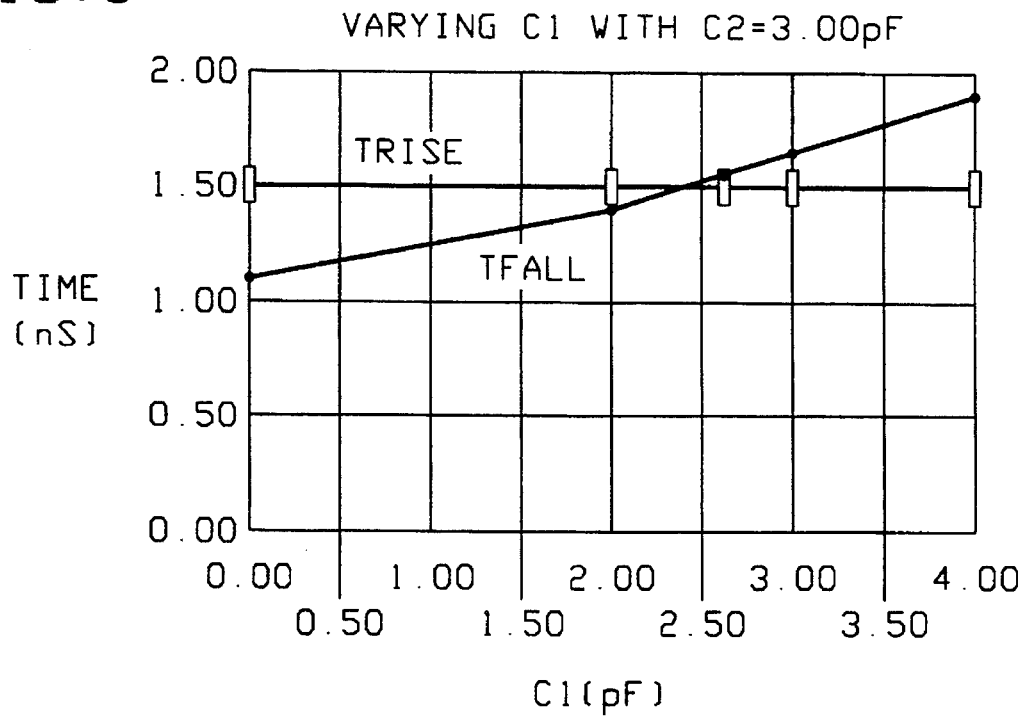
FIGS. 5 and 6 each illustrate, for the driver of FIG. 3, effects of changing one of the capacitances on driver output rise time and on driver output fall time.
Figure 6:
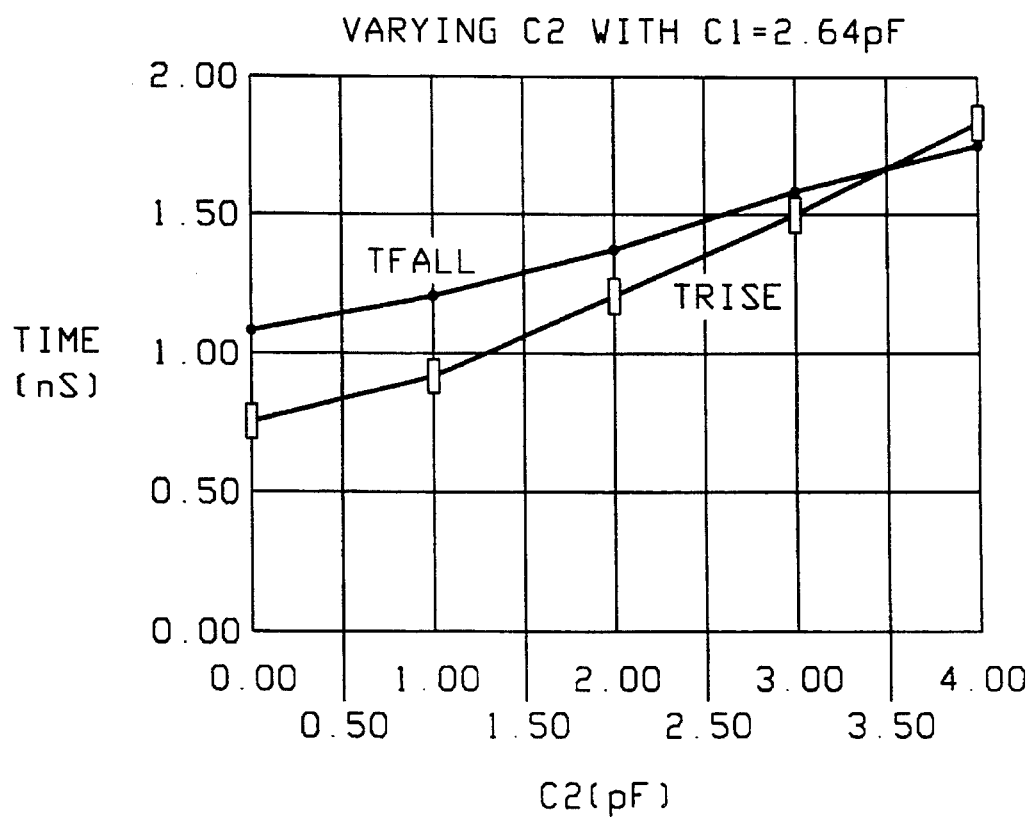

FIG. 5 is a plot of output rise time (TRISE) and output fall time (TFALL) for driver 28 when the value of capacitor 42 is varied while the value of capacitor 44 is held constant at 3.0 picofarads. FIG. 6 shows the converse situation, being a plot of output rise time (TRISE) and output fall time (TFALL) for driver 28 when the value of capacitor 44 is varied while the value of capacitor 42 is held at 2.64 picofarads. For the simulation used to generate Table 1 and FIGS. 5 and 6, load resistors $RC_1$ and $RC_2$ are each set to 290 ohms, current source 32 is set to produce a constant current of 4.5 milliamperes, rise time TR and fall time TF are measured from 20 percent to 80 percent, and propagation delays TD++ and TD— are measured from 50 percent of the input to −1.3 volts on the output. As can be seen from Table 1 and FIGS. 5 and 6, capacitor 44 sets the driver 28 rise time, and selection of the capacitances of capacitor 42 and capacitor 44 can determine both driver output rise time and driver output fall time. Thus, a relatively independent adjustment of both the output rise time and the output fall time is provided by the apparatus of FIGS. 3 and 4. Such apparatus can, if desired, provide equal rise and fall times for the output of driver 28.

Figure 7:
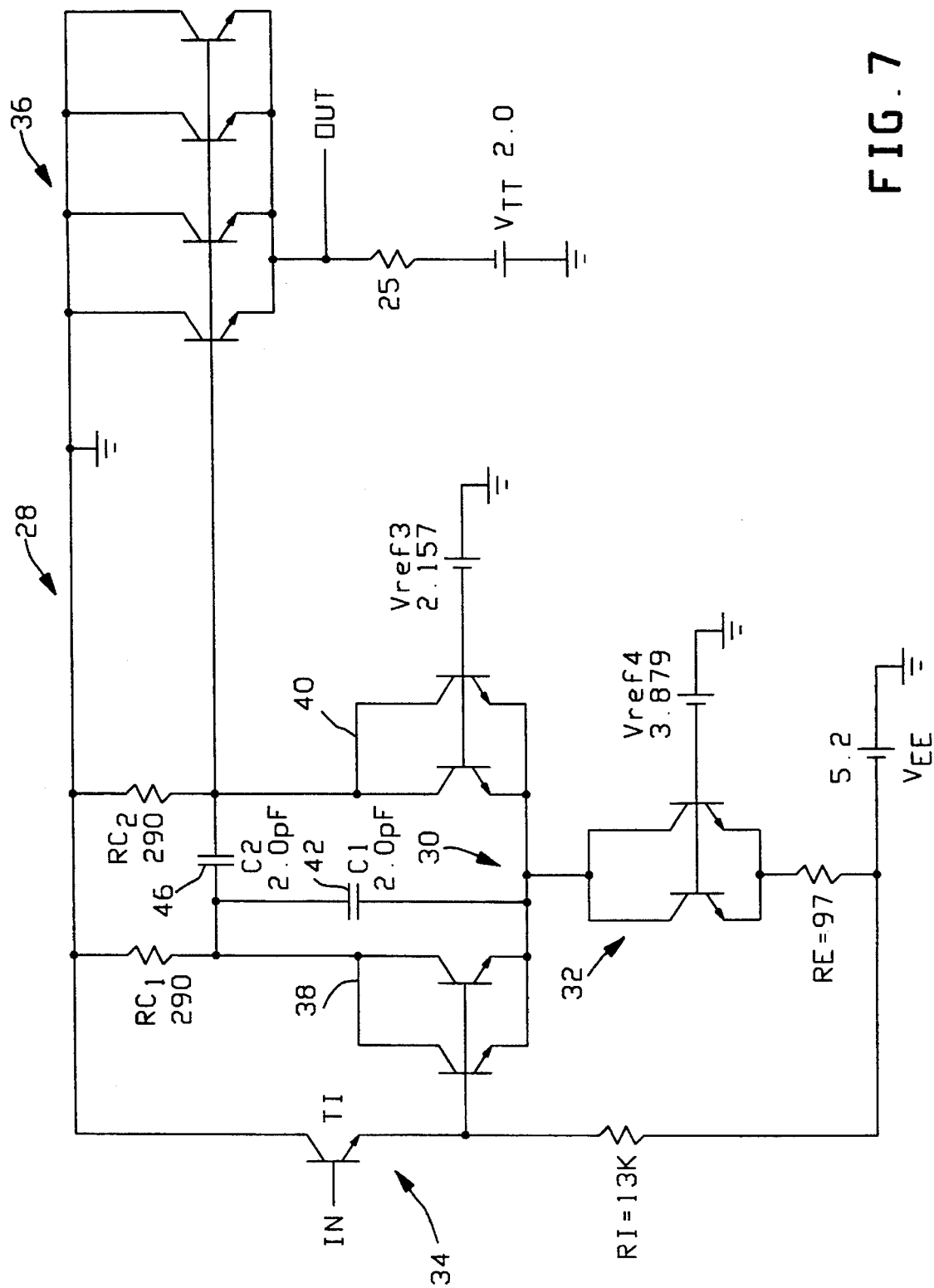
FIG. 7 is a schematic diagram of another embodiment of an ECL driver according to the present invention.
Figure 12:
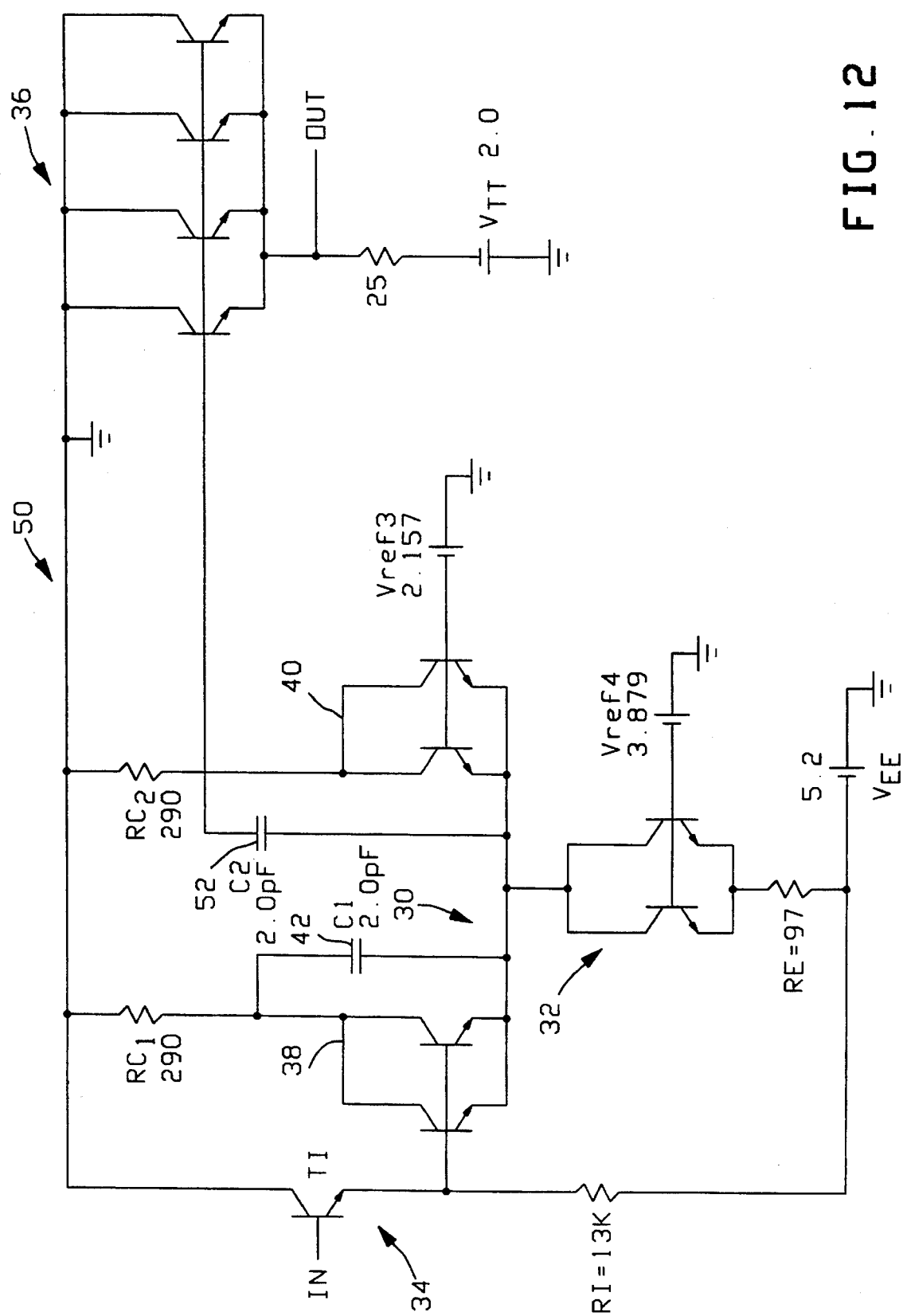
FIG. 12 is a schematic diagram of yet another embodiment of an ECL driver according to the present invention.

FIG. 7 and FIG. 12 show two other embodiments of the present invention, to provide the user with some flexibility in his implementation due to any processing limitations and/or die layout.

Figure 2:
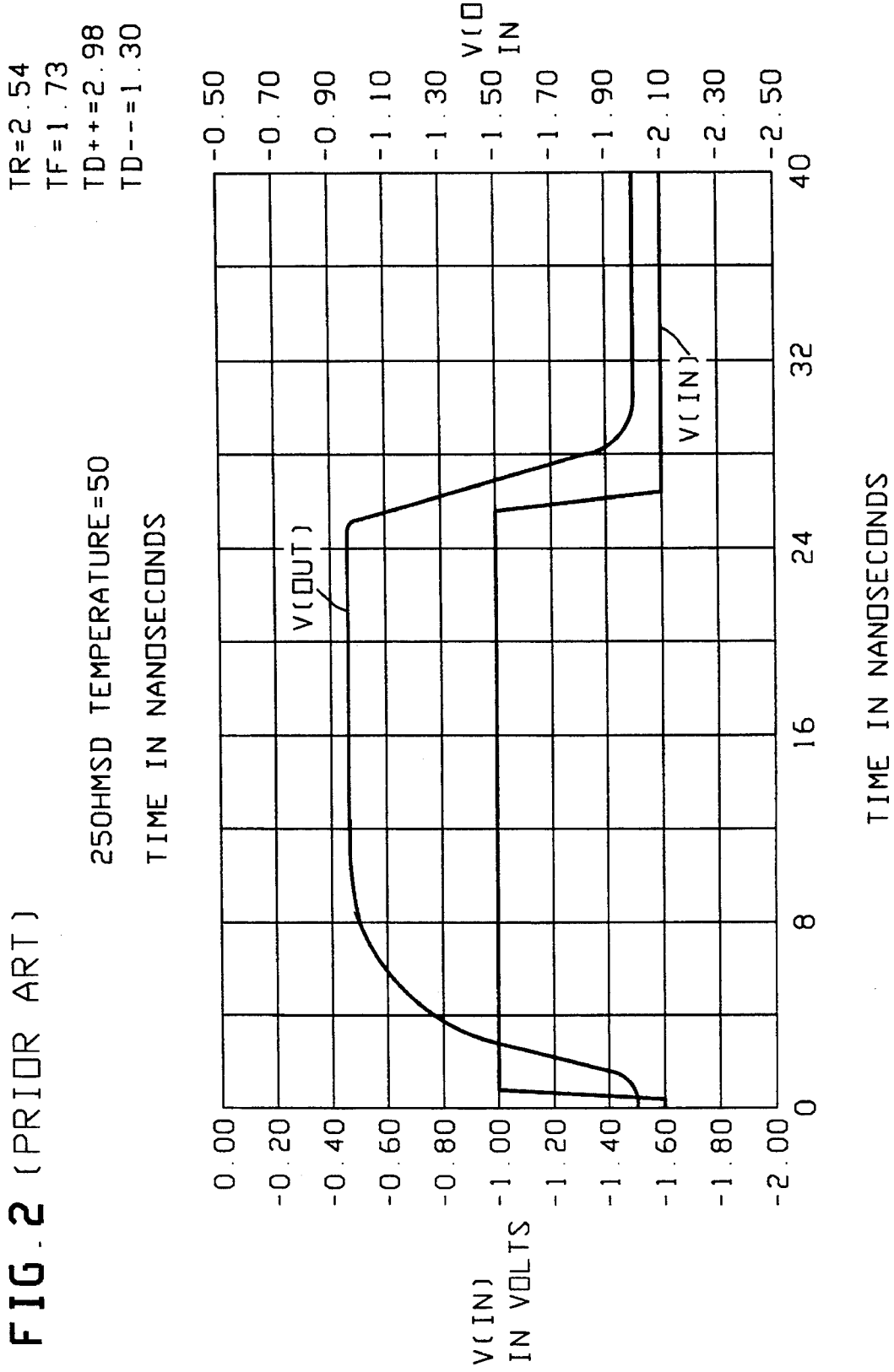
FIG. 2 is a waveform timing diagram for an input signal to, and the resulting response output signal from, the driver of FIG. 1.
Figure 8:
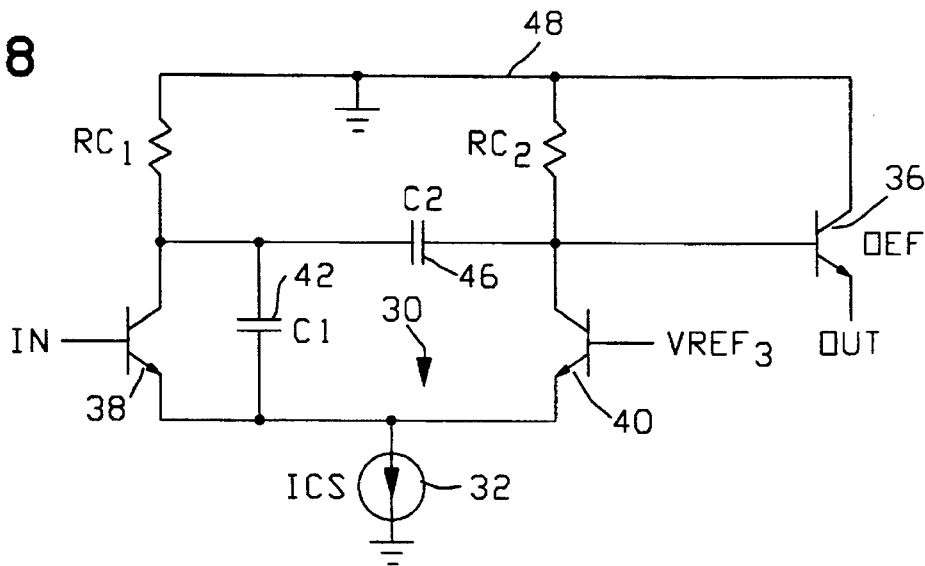
FIG. 8 is a simplified schematic diagram of the driver of FIG. 7.
Figure 9:
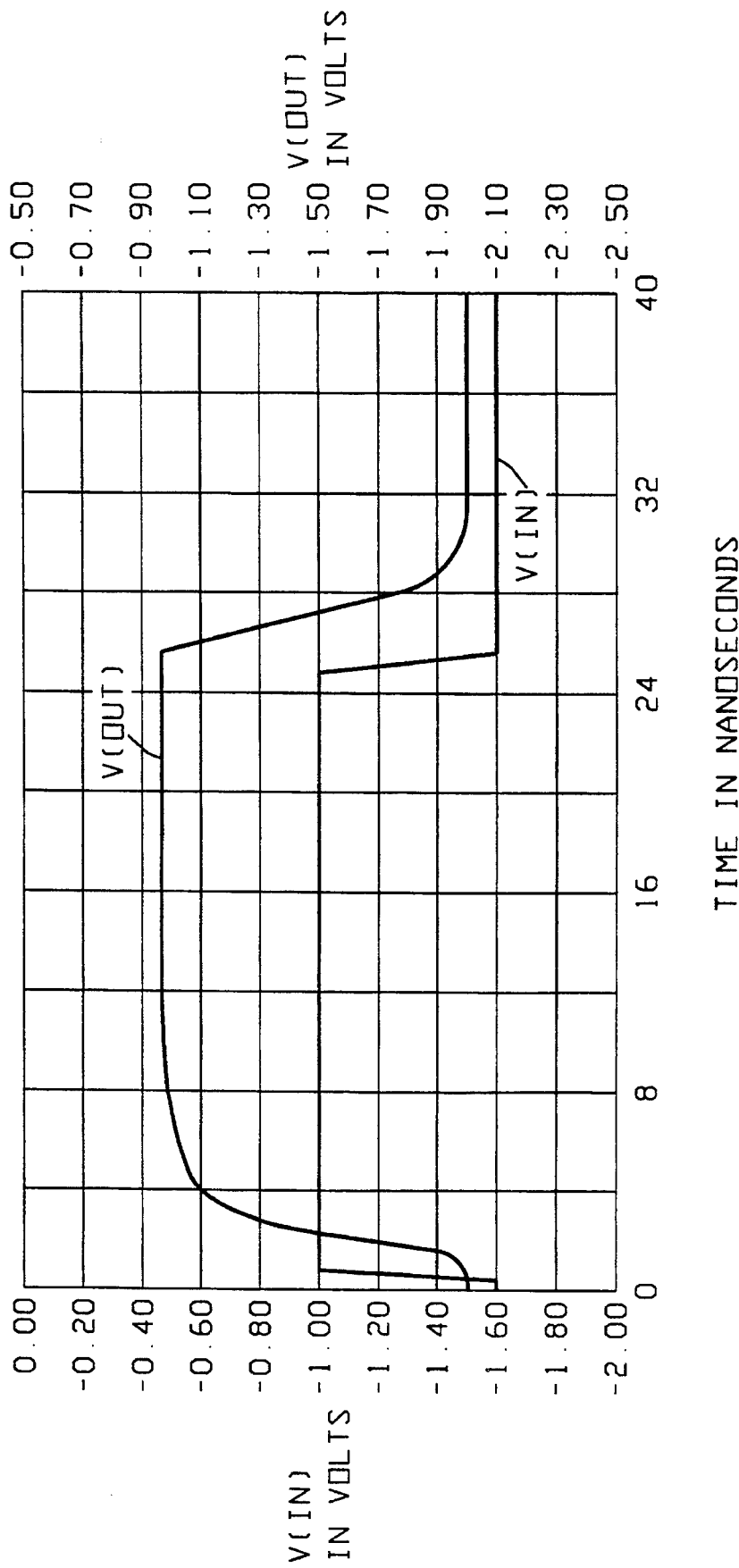
FIG. 9 is a waveform timing diagram for an input signal that can be applied to the input of the driver of FIG. 7 and further showing an output signal produced by the driver of FIG. 7 in response to that input signal.
Figure 10:
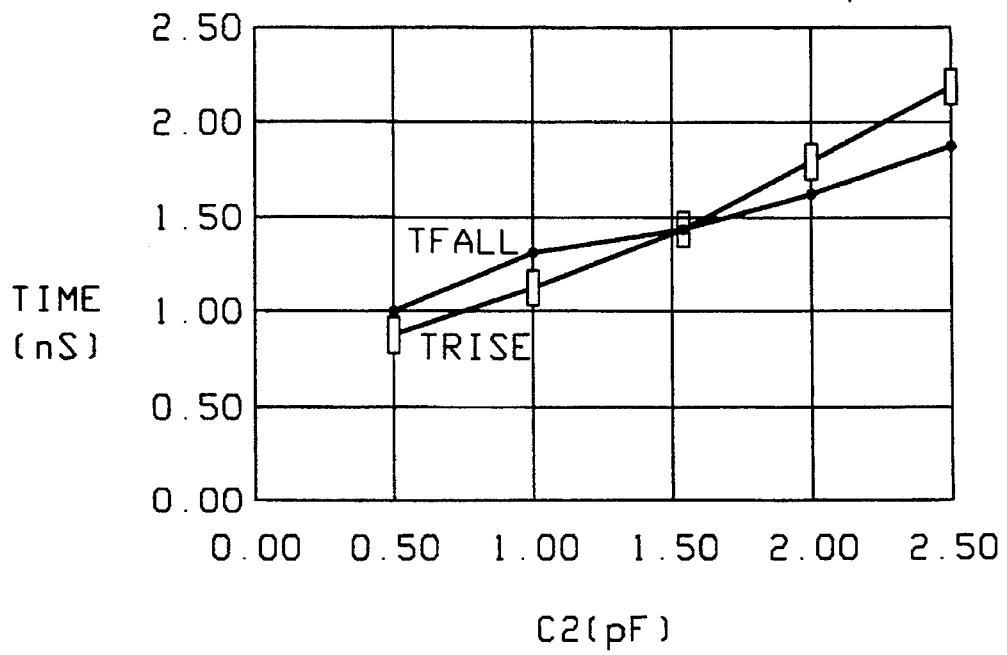
FIGS. 10 and 11 each illustrate, for the driver of FIG. 7, effects of changing one of the capacitances on driver output rise time and on driver output fall time.
Figure 11:
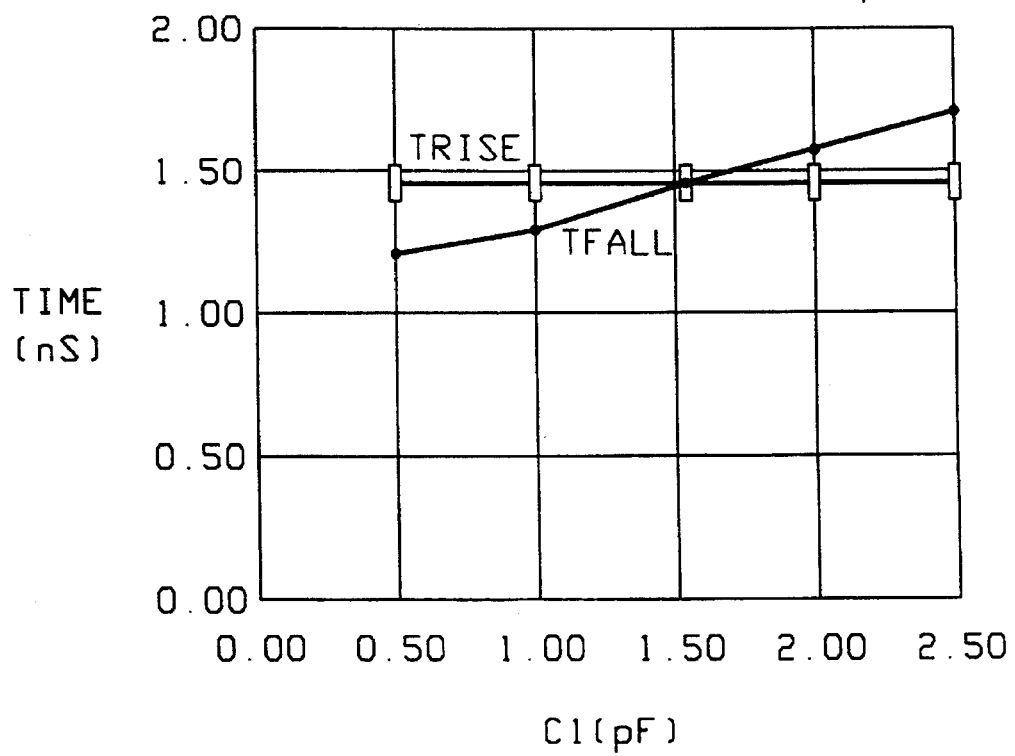

FIG. 7 is a schematic diagram of another embodiment of an ECL cut-off driver according to the present invention which is similar to that of FIG. 3 except that capacitors C1 and C2 are differently connected. As shown in FIG. 7, capacitor 44 has been deleted, and instead capacitor 46 has been added as capacitor C2. Capacitor C2 is placed between the low side of both "swing" resistors $RC_1$ and $RC_2$, and thus is connected between the collector(s) of the transistor(s) of NOR side 38, and the collector(s) of the transistor(s) of OR side 40 (and thus the base(s) of the transistor(s) of OEF 36). Each of NOR side 38, OR side 40, current source 32, and OEF 36 can have one or more transistors; a single transistor for each is illustrated in FIG. 8 for convenience and for simplicity of illustration. Results of a SPICE simulation of the driver of FIG. 7 are shown in FIGS. 9, 10 and 11, and in Tables 2 and 3 below. For this simulation, the electric current settings, voltage settings, component settings, definition of parameters, input, output loading, and measurement of parameters are as described above for FIGS. 2, 5 and 6 and Tables 0 and 1.

TABLE 2

| C1(pF) | C2(pF) | TR(ns) | TF(ns) | TD++(ns) | TD—(ns) |
|---|---|---|---|---|---|
| 1.00 | 1.00 | 1.14 | 1.10 | 1.72 | 1.08 |
| 2.00 | 2.00 | 1.79 | 1.79 | 2.37 | 1.39 |
| 3.00 | 3.00 | 2.52 | 2.56 | 3.07 | 1.70 |
| 1.55 | 0.50 | 0.90 | 1.02 | 1.42 | 1.03 |
| 1.55 | 1.00 | 1.14 | 1.33 | 1.73 | 1.14 |
| 1.55 | 1.55 | 1.48 | 1.47 | 2.08 | 1.25 |
| 1.55 | 2.00 | 1.79 | 1.68 | 2.37 | 1.33 |
| 1.55 | 2.50 | 2.15 | 1.92 | 2.71 | 1.43 |
| 0.50 | 1.55 | 1.48 | 1.22 | 2.06 | 1.14 |
| 1.00 | 1.55 | 1.48 | 1.33 | 2.07 | 1.19 |
| 1.55 | 1.55 | 1.48 | 1.47 | 2.08 | 1.25 |
| 2.00 | 1.55 | 1.48 | 1.58 | 2.08 | 1.31 |
| 2.50 | 1.55 | 1.48 | 1.70 | 2.09 | 1.37 |

TABLE 3

| C1 = C2(pF) | TR(ns) | TF(ns) | TD++(ns) | TD—(ns) |
|---|---|---|---|---|
| 0 | 0.74 | 0.61 | 1.07 | 0.73 |
| 0.5 | 0.90 | 0.81 | 1.40 | 0.91 |
| 1.0 | 1.14 | 1.10 | 1.72 | 1.08 |
| 1.5 | 1.45 | 1.43 | 2.04 | 1.24 |
| 2.0 | 1.79 | 1.79 | 2.37 | 1.39 |
| 2.5 | 2.15 | 2.18 | 2.72 | 1.55 |
| 3.0 | 2.52 | 2.56 | 3.07 | 1.70 |

As seen in FIG. 9, the 1.5 times multiple of output rise time versus output fall time of driver 10 is avoided by driver 48.

As can be seen in FIG. 10, for the driver of FIGS. 7 and 8 the desired rise time can be made to be equal to the desired fall time, thus increasing the propagation delay TD++ only by the increase of the fall time, so that a faster driver (compared with driver 10 of FIG. 1) is thereby provided. For the same output fall time, C1+C2 (the capacitance of capacitors 42 and 46) for FIGS. 7 and 8 is less than C (the capacitance of capacitor 26) for FIG. 1. With the configuration of FIG. 7, the rise and fall times of the output of driver 48 can be made equal, or can be adjusted to fit the need while maintaining a propagation delay TD++ which increases only by an amount equal to the desired increase in fall time.

With driver 28 of FIG. 3, and driver 50 of FIG. 12, the rise and fall times of the driver output can be made equal, or can be adjusted to fit the need while maintaining a propagation delay TD++ which increases only by an amount equal to the desired increase in fall time.

Figure 1:
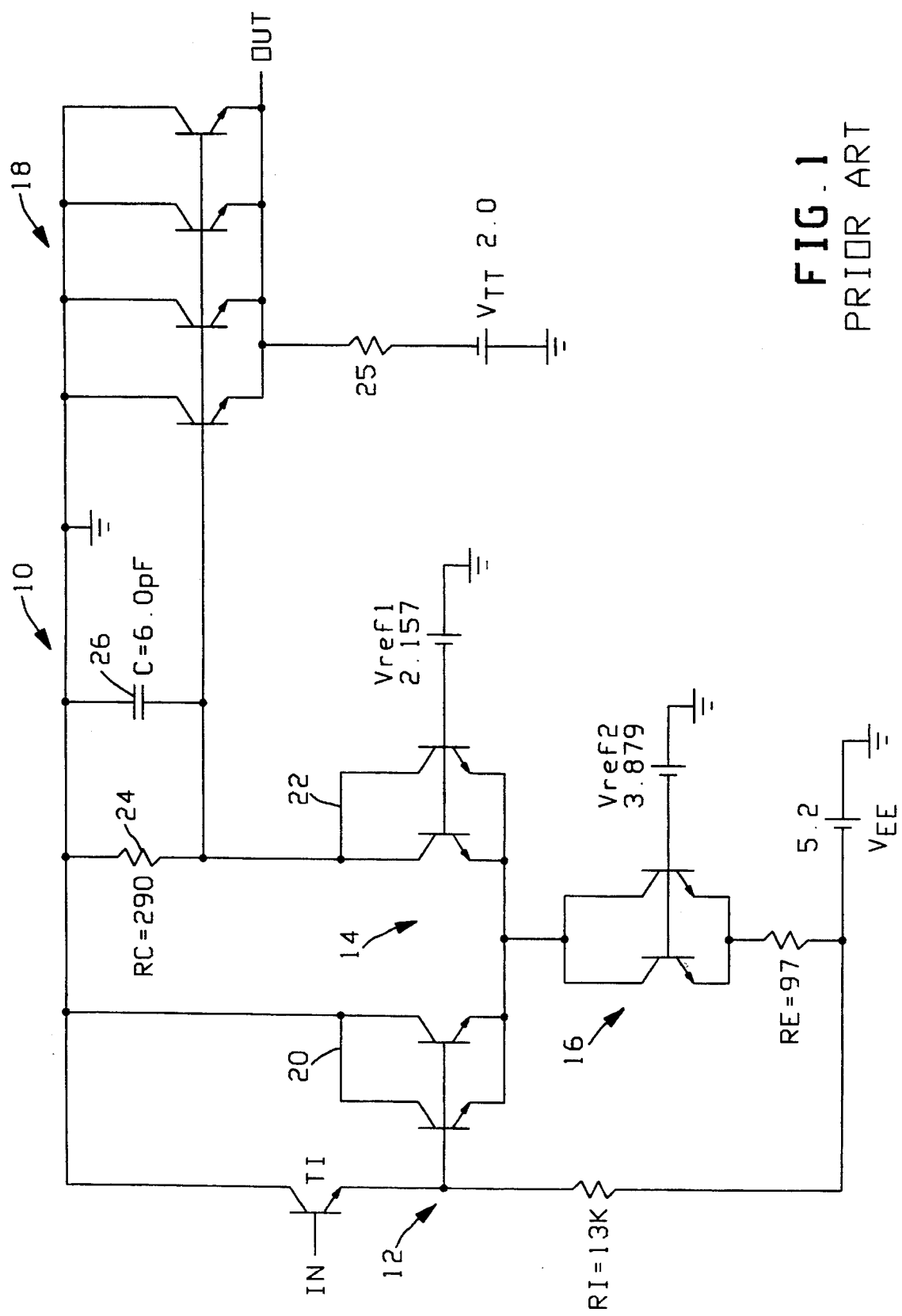
FIG. 1 is a schematic diagram of a prior art ECL driver.

Particularly comparing Table 0 and Table 3, the driver 48 of FIG. 7 requires only about two-thirds the capacitance of driver 10 of FIG. 1 for the same fall time. Also, the propagation delay TD++ increases only by approximately delta TF, or the corresponding change in fall time. Also, when the capacitances C1 and C2 are equal, then for all practical purposes rise time TR=fall time TF.

In driver 10 of FIG. 1, the capacitance C of capacitor 26 is obtained by using junction capacitance of a P-N junction that is always reverse biased. In driver 48 of FIG. 7, C2 capacitor 46 must be of the "parallel plate" variety since the polarity of the voltage across it changes, and so its constant reverse biasing cannot be guaranteed. To provide a fall time TF of 1.7 nanoseconds, in driver 10 of FIG. 1 the effective capacitance required would be 6 picofarads, while with driver 48 of FIG. 7, an effective capacitance of 4 picofarads would be required. Therefore, the total required capacitance of driver 48 requires less than the area required for capacitor 26 of driver 10 of FIG. 1, to provide the hypothetically desired fall time of 1.7 nanoseconds. Thus, with the driver of FIG. 7, the user can obtain his or her desired transition time or times, and obtain better signal edges, using less capacitance, and less silicon area, than would be the case for the driver of FIG. 1.

Figure 14:
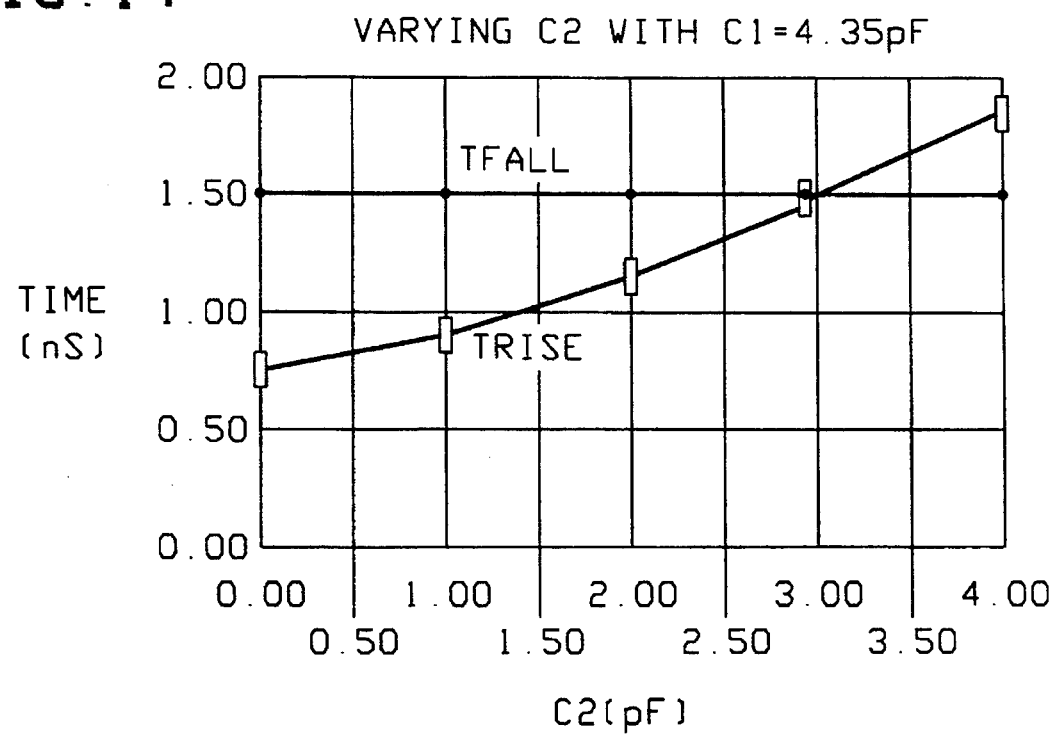
FIGS. 14 and 15 illustrate, for the driver of FIG. 12, effects of changing one of the capacitances on driver output rise time and on driver output fall time.
Figure 15:
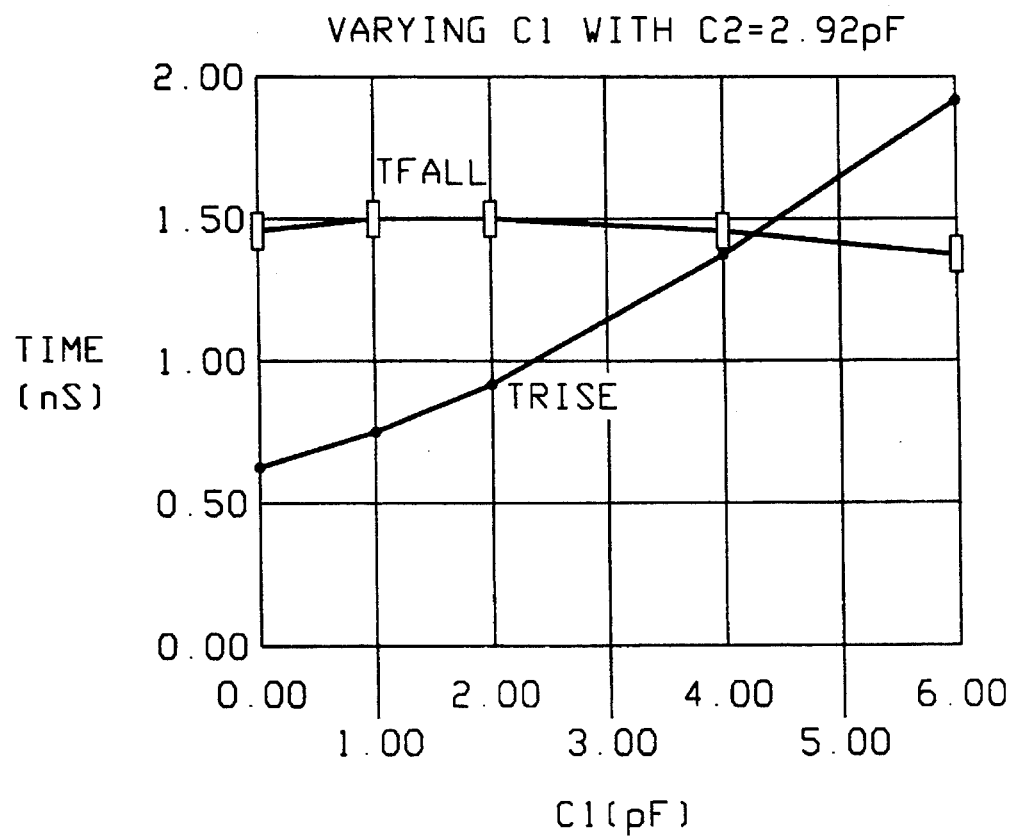

As can be seen from FIG. 10, C2 capacitor 46, like C2 capacitor 44 of FIGS. 3 and 4, sets the driver output rise time, while the fall time can be set by the value of capacitor 42 and the value of capacitor 46 together. However, unlike the situation with driver 28, C2 capacitor 46 cannot be a junction capacitor for reasons given above. Also, both driver 28 and driver 48 provide maximum propagation delay TD++. To avoid this last shortcoming, but at the expense of higher capacitance, driver 50 of FIG. 12 could be substituted. FIG. 12 is also desirable in that both C1 capacitor 42 and C2 capacitor 52 can each be junction capacitors, and in that C2 capacitor 52 independently sets driver 50 output rise time while C1 capacitor 42 independently sets driver 50 output fall time, as shown in FIGS. 14 and 15. Results of a SPICE simulation of the driver of FIG. 12 are given in FIGS. 14 and 15, and in Table 4 below. For this simulation, the current, voltage and component settings, definition of parameters, input, output loading, and measurement of parameters are as described above for FIGS. 2, 5, 6, 9, 10 and 11, and for Tables 0, 1, 2 and 3. FIG. 14 is a plot of output rise time (TRISE) and output fall time (TFALL) for driver 50 when the value of C2 capacitor 52 is varied while the value of C1 capacitor 42 is held constant at 4.35 picofarads. FIG. 15 is a plot of output rise time (TRISE) and output fall time (TFALL) for driver 50 when the value of C1 capacitor 42 is varied while the value of C2 capacitor 52 is held constant at 2.92 picofarads.

TABLE 4

| C1(pF) | C2(pF) | TR(ns) | TF(ns) | TD++(ns) | TD--(ns) |
|---|---|---|---|---|---|
| 2.00 | 2.00 | 1.21 | 0.93 | 1.56 | 0.99 |
| 4.00 | 4.00 | 1.85 | 1.40 | 2.05 | 1.35 |
| 6.00 | 6.00 | 2.51 | 1.92 | 2.59 | 1.70 |
| 4.35 | 0.00 | 0.74 | 1.49 | 1.18 | 1.35 |
| 4.35 | 1.00 | 0.89 | 1.49 | 1.36 | 1.36 |
| 4.35 | 2.00 | 1.16 | 1.49 | 1.56 | 1.38 |
| 4.35 | 2.92 | 1.47 | 1.49 | 1.76 | 1.40 |
| 4.35 | 4.00 | 1.84 | 1.49 | 2.05 | 1.41 |
| 0.00 | 2.92 | 1.48 | 0.62 | 1.71 | 0.71 |

TABLE 4-continued

| C1(pF) | C2(pF) | TR(ns) | TF(ns) | TD++(ns) | TD--(ns) |
|---|---|---|---|---|---|
| 1.00 | 2.92 | 1.50 | 0.73 | 1.76 | 0.84 |
| 2.00 | 2.92 | 1.50 | 0.92 | 1.78 | 1.00 |
| 4.00 | 2.92 | 1.47 | 1.39 | 1.77 | 1.34 |
| 6.00 | 2.92 | 1.40 | 1.91 | 1.75 | 1.66 |

In comparing the respective drivers of FIG. 3, FIG. 7 and FIG. 12, the following observations can be made. Driver 28 of FIG. 3 uses the least capacitance, driver 48 of FIG. 7 uses average capacitance, and driver 50 of FIG. 12 uses the most capacitance. For all three drivers, capacitor C2 alone sets the output rise time. For driver 48 of FIG. 7, capacitor C2 cannot be a junction capacitor because its reverse-biasing cannot be assured; this is not so for driver 28 of FIG. 3 nor driver 50 of FIG. 12, nor for capacitor C1 in any of those three drivers. In driver 28 of FIG. 3 and driver 48 of FIG. 7, the combination of capacitor C1 and capacitor C2 together determine the output fall time, while with driver 50 of FIG. 12 capacitor C1 alone sets the output fall time. Driver 28 of FIG. 3 and driver 48 of FIG. 7 each have relatively greater propagation delay TD++ than does driver 50 of FIG. 12.

In the present invention, equal rise and fall times are preferred, to reduce delay.

In the present invention, a junction capacitor can be provided by a transistor having two leads (such as the base and emitter, or the collector and emitter) tied together; the junction capacitance of the resulting device can then be used as capacitor C1 or capacitor C2. If needed, two or more such transistors can be connected in parallel, to provide the desired capacitance.

Figure 13:
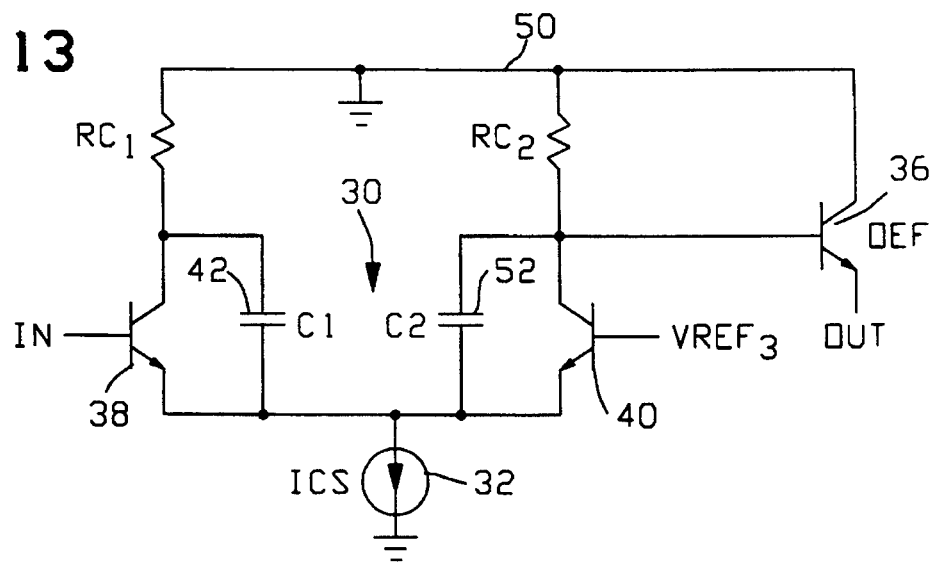
FIG. 13 is a simplified schematic diagram of the driver of FIG. 12.

It should be understood that the number of transistors used in any portion of the present invention can be varied as needed. For example, each transistor of FIG. 4, FIG. 8 and FIG. 13 can each be considered to represent a single transistor or a plurality of transistors. Also, in each of FIGS. 3, 4, 7, 8, 12 and 13, a single current switch is shown, but in each case multiple current switches could be used in a single such driver. For example, two current switches could be used in a single driver, connected in parallel to a common output but having separate inputs, with one such switch being connected directly to the current source while the other switch draws its current from the NOR side of the first switch. Also, where a single capacitor is shown, a plurality of capacitors could be connected in parallel to provide the desired total capacitance for capacitor C1 or capacitor C2.

The component and signal values given above for the respective SPICE simulations of drivers 28, 48 and 50 are for ECL cutoff drivers. However, the present invention provides similar results with non-cutoff drivers. Non-cutoff drivers have the same schematic diagrams (including but not limited to connection of capacitors C1 and C2) as those of FIGS. 3, 4, 7, 8, 12 and 13. For a non-cutoff driver, resistors $RC_1$ and $RC_2$ could each be 330 ohms, and current source 32 could generate a constant current of 3.0 milliamperes. Other values, for non-cutoff drivers as well as cutoff drivers, should be readily apparent to those of ordinary skill in the art, and would fall within the practice of the present invention.

Although drivers 28, 48 and 50 are each designed for implementation in a silicon integrated circuit, the present invention can be practiced with other materials, realizations and implementations, such as breadboarding or printed circuits.

Figure 16:
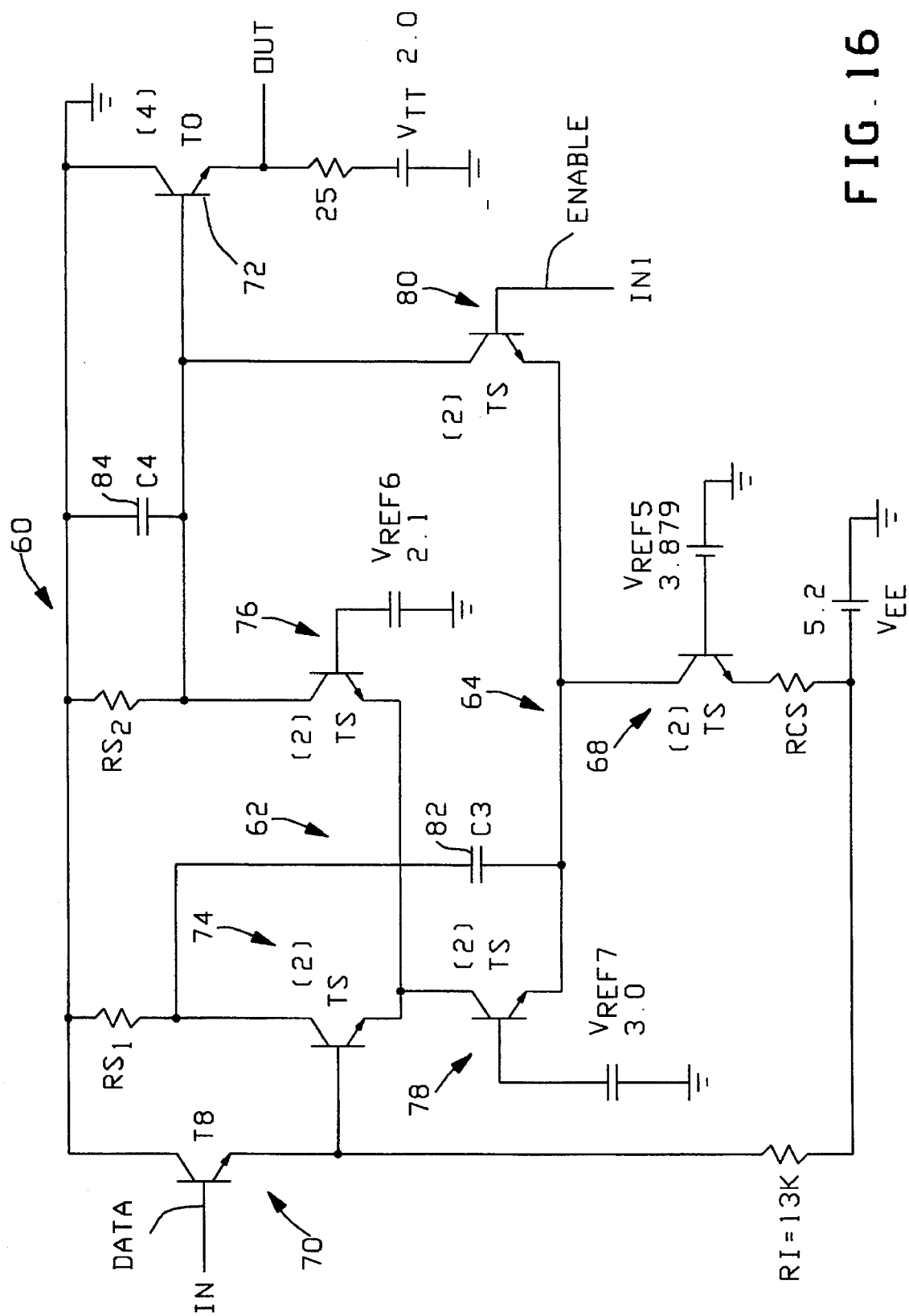
FIG. 16 is a schematic diagram of one embodiment of a multi-level or series-gated ECL driver according to the present invention.

As discussed above, the present invention can be practiced advantageously not only with the single-level or non-series gated drivers of FIGS. 3, 4, 7, 8, 12 and 13, but also with multi-level or series-gated ECL drivers. One embodiment of a multi-level or series-gated ECL cutoff driver according to the present invention is illustrated in FIG. 16. There is shown in FIG. 16 an ECL cutoff driver 60 according to the present invention including a current switch 62, a current switch 64 and a current source 68. Driver 60 can, if desired, also include an emitter follower 70 serving as an input buffer, and an emitter follower 72 serving as an output buffer. Input signal IN is applied to the input of input emitter follower 70 (that is, the base electrode(s) of the transistor(s) of emitter follower 70) and, as buffered thereby, is provided to NOR side 74 of current switch 62. Current switch 62 includes a NOR switch or NOR side 74 and an OR switch or OR side 76. Likewise, current switch 64 includes a NOR switch or NOR side 78 and an OR switch or OR side 80. In the absence of emitter follower 70, input signal DATA would be applied at input IN directly to the base(s) of the transistor(s) of the NOR side 74 of current switch 62. The transistor(s) of current source 68 are biased up by reference voltage $V_{REF5}$ so that current source 68 serves as a constant current generator, so voltage $V_{EE}$ pulls constant current through either side 78 or 80 of current switch 64. Also, if NOR side 78 of current switch 64 is conducting, then voltage $V_{EE}$ also pulls constant current through either side 74 or 76 of current switch 62. The input signal DATA applied to input IN, and reference voltage $V_{REF6}$, together determine which side 74 or 76, if any, of current switch 62 is to be turned "on"; both sides are "on" only during transitions. Similarly, input signal ENABLE applied to input IN1, and reference voltage $V_{REF7}$, together determine which side 80 or 78 of current switch 64 is to be turned "on"; both sides are "on" only during transitions. Each side 74 and 76 of current switch 62 is provided with a respective load or "swing" resistor $RS_1$ and $RS_2$.

Figure 19:
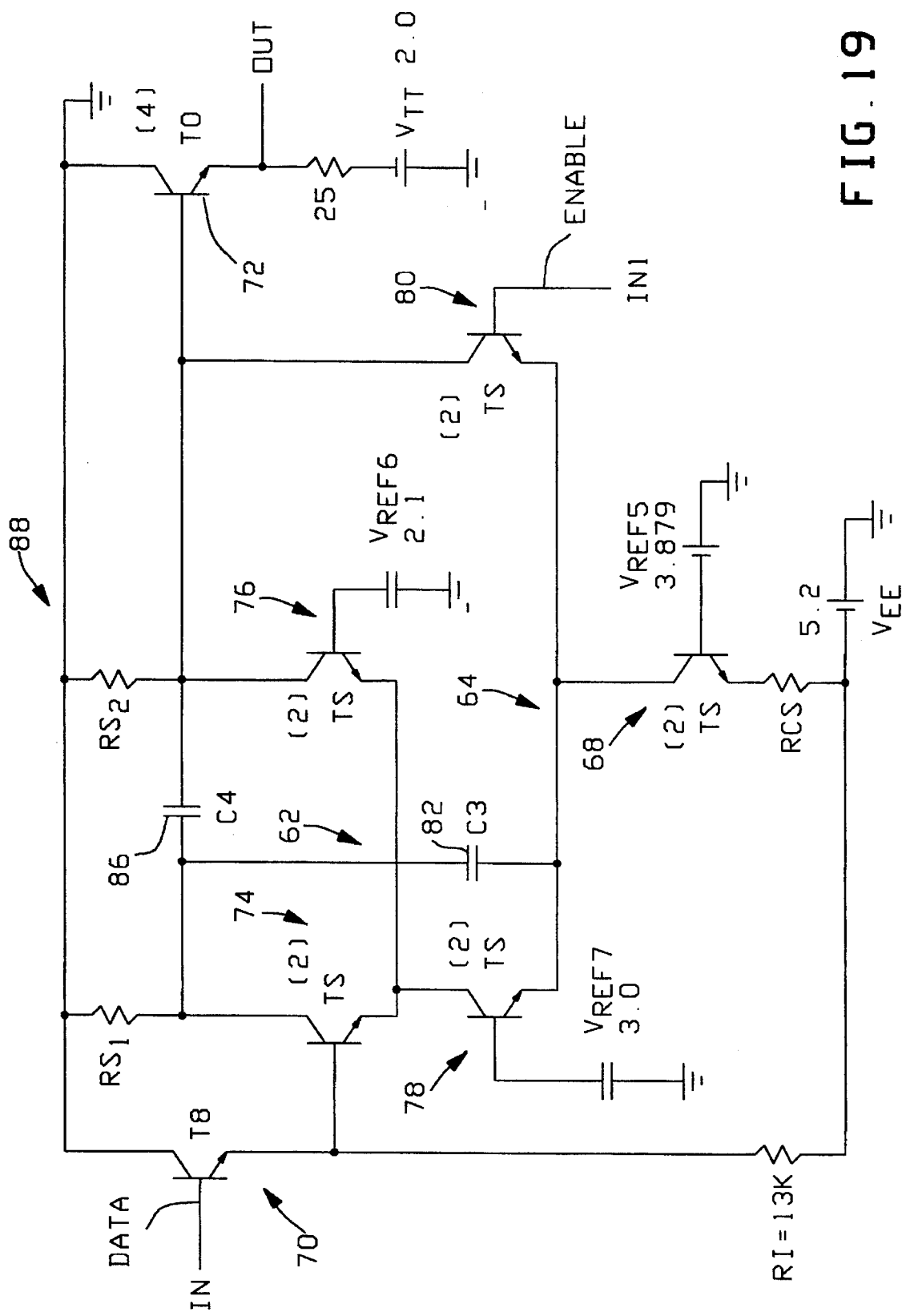
FIG. 19 is a schematic diagram of another embodiment of a multi-level or series-gated ECL driver according to the present invention.
Figure 22:
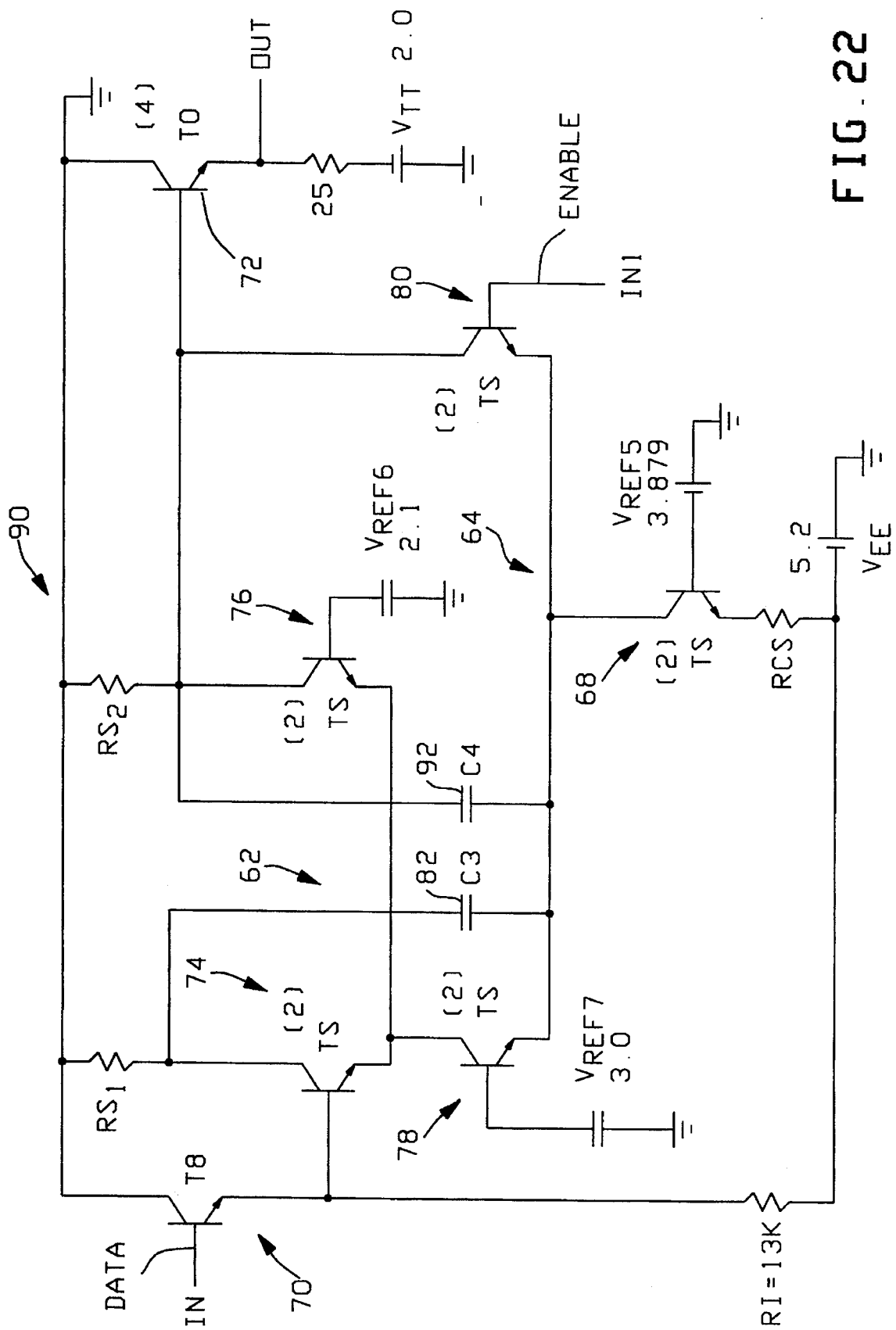
FIG. 22 is a schematic diagram of yet another embodiment of a multi-level or series-gated ECL driver according to the present invention.
Figure 23:
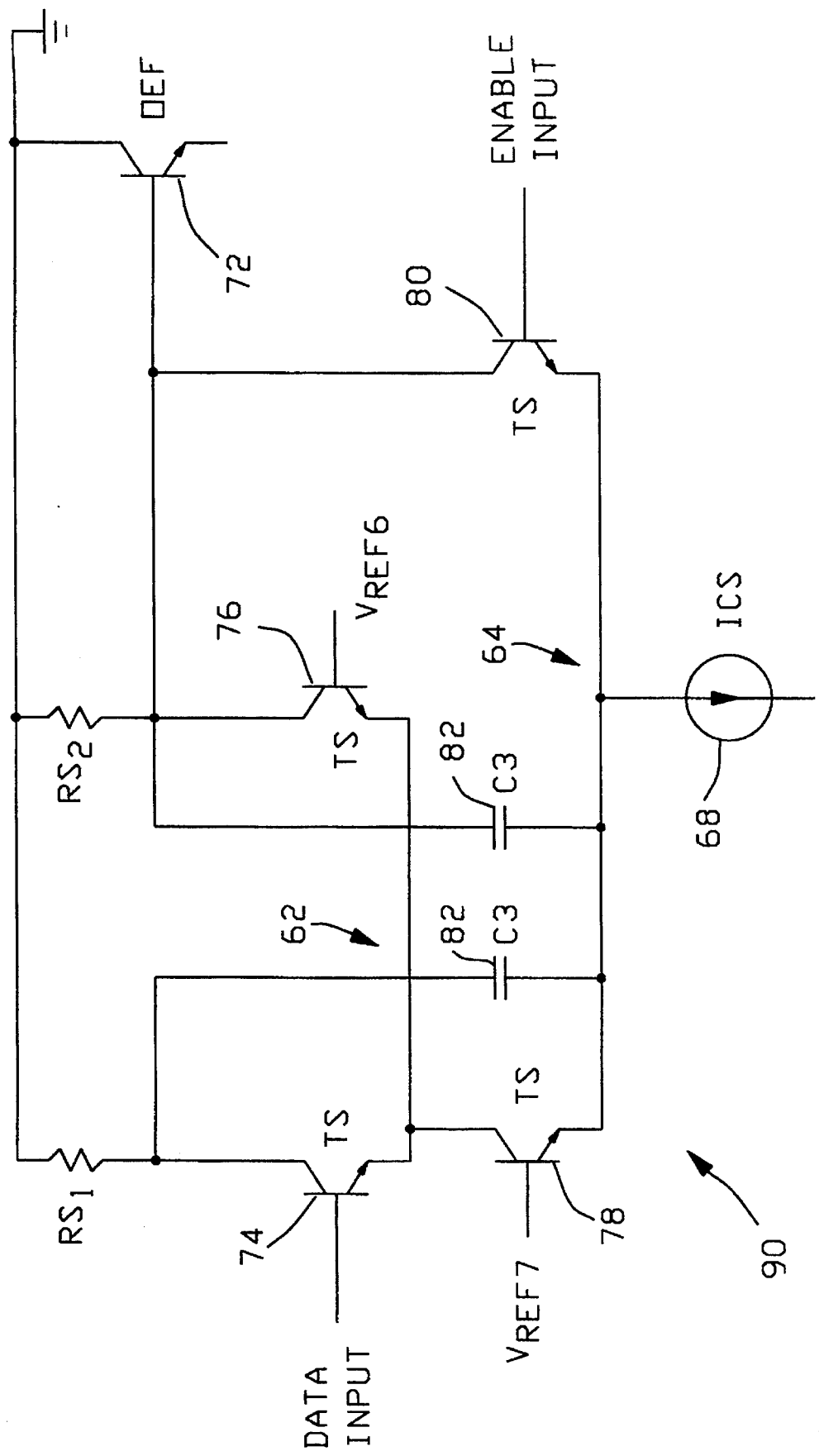
FIG. 23 is a simplified schematic diagram of the driver of FIG. 22.

In each of FIGS. 16, 19 and 22, it should be understood that in each case, where a single transistor is illustrated, multiple transistors can be employed instead. The Arabic numeral in parentheses beside each such transistor in FIGS. 16, 19 and 22 indicates the preferred number of transistors to be connected together in parallel respectively at each such location.

Figure 17:
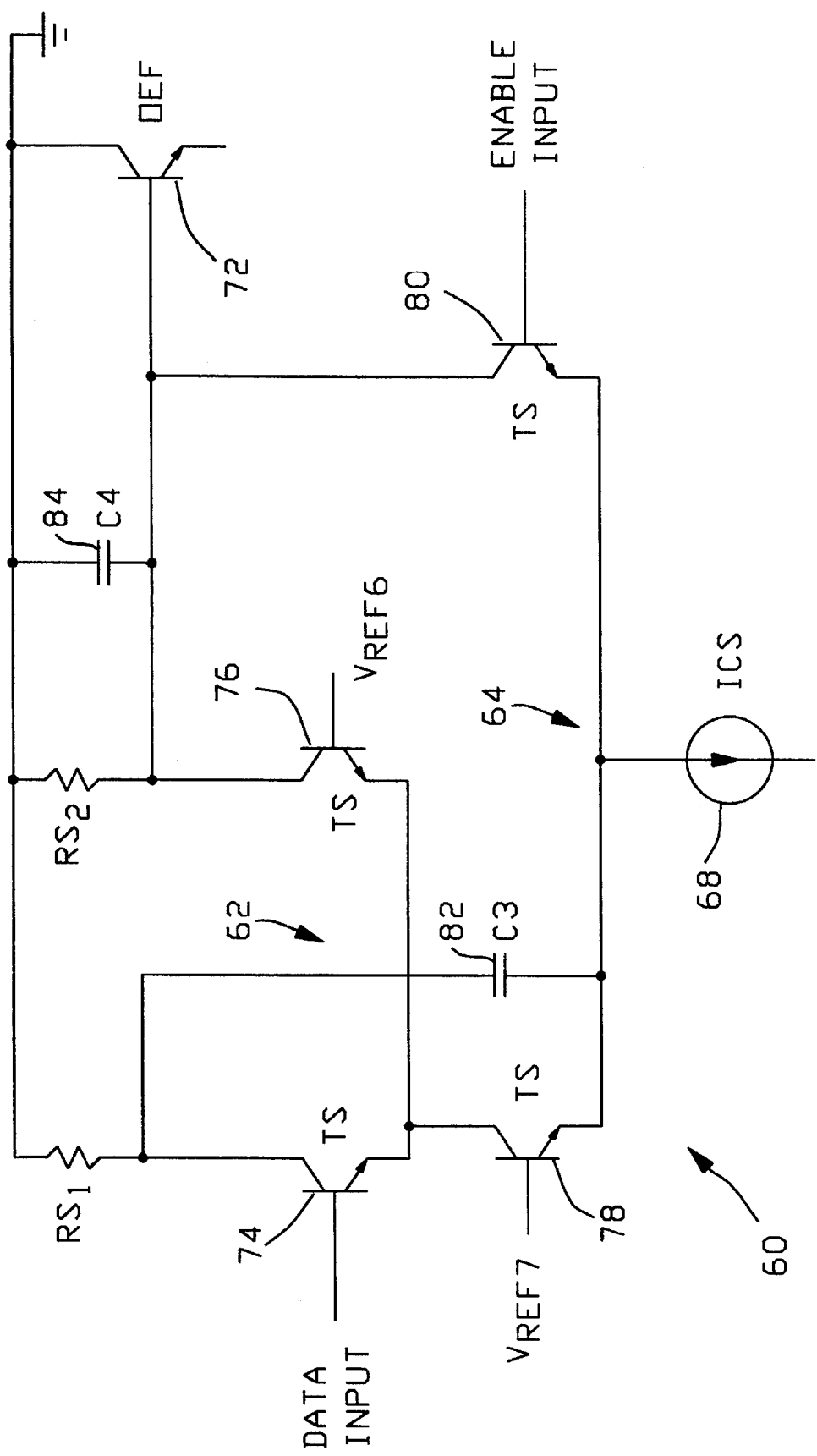
FIG. 17 is a simplified schematic diagram of the driver of FIG. 16.

Driver 60 further includes capacitors 82 and 84 respectively also identified in FIGS. 16 and 17 as C3 and C4. Capacitor C3 is placed between current switch 62 and current source 68, that is between the collector(s) of the NOR side 74 transistor(s) of current switch 62, and the input side of current source 68. At the side of C3 capacitor 82 connected to current source 68, C3 capacitor 82 is thus also connected to the emitter(s) of the NOR side 78 and the emitter(s) of the OR side 80 of current switch 64. C4 capacitor 84 is connected across load or "swing" resistor $RS_2$. Capacitors 82 and 84 slow down driver 60. FIG. 17 is a more simplified schematic diagram of the driver 60 of FIG. 16.

Current source 68 preferably provides a constant current comparable to that of current source 32. Increased current output increases the speed of the driver, but also increases power consumption.

The configuration of FIG. 16 was simulated using the simulation program SPICE (Simulation Program with Integrated Circuit Emphasis), discussed above. The results of the simulation are shown in Table 5 below, wherein C3 is capacitor 82, C4 is capacitor 84, DATA INPUT refers to output at the output of driver 60 values when the ENABLE input is held constant, ENABLE input refers to output values at the output of driver 60 when the DATA input is held constant, TR is rise time of the driver 60 output, TF is fall time of the driver 60 output, TD++ is the propagation delay when the driver 60 DATA input and output are both going positive with the ENABLE input held constant, TD−− is the propagation delay when the driver 60 DATA input and output are both going negative with the ENABLE input held constant, TD+− is the propagation delay when the ENABLE input is going positive while the DATA input is held constant and the driver 60 output is going negative, and TD−+ is the propagation delay when the DATA input is held constant, the ENABLE input is going negative, and the driver 60 output is going positive. A suitable pulse input, and a suitable load at the output, were used for the simulation. In Tables 5, 6 and 7, all capacitances are shown in picofarads (pF) at both columns C3 and C4, and times in the other eight columns of each of Tables 5, 6 and 7 are shown in nanoseconds (ns).

TABLE 5

| | | DATA INPUT | | | | ENABLE INPUT | | | |
| --- | --- | --- | --- | --- | --- | --- | --- | --- | --- |
| C3 | C4 | TR | TF | TD++ | TD— | TR | TF | TD+— | TD—+ |
| 1.00 | 1.00 | 0.99 | 0.62 | 1.49 | 1.00 | 0.99 | 0.91 | 0.82 | 1.42 |
| 2.00 | 2.00 | 1.26 | 1.34 | 1.80 | 1.26 | 1.27 | 1.31 | 1.05 | 1.72 |
| 4.00 | 4.00 | 1.91 | 2.24 | 2.45 | 1.80 | 1.91 | 2.18 | 1.48 | 2.36 |
| 1.00 | 2.74 | 1.49 | 1.25 | 2.03 | 1.21 | 1.49 | 1.22 | 1.04 | 1.96 |
| 2.00 | 2.74 | 1.49 | 1.48 | 2.03 | 1.36 | 1.49 | 1.46 | 1.15 | 1.96 |
| 3.00 | 2.74 | 1.49 | 1.73 | 2.04 | 1.50 | 1.49 | 1.69 | 1.23 | 1.96 |
| 4.00 | 2.74 | 1.50 | 1.99 | 2.05 | 1.62 | 1.49 | 1.93 | 1.30 | 1.96 |
| 2.13 | 1.00 | 0.99 | 1.19 | 1.50 | 1.13 | 0.99 | 1.16 | 0.91 | 1.41 |
| 2.13 | 2.00 | 1.26 | 1.37 | 1.80 | 1.28 | 1.26 | 1.34 | 1.06 | 1.73 |
| 2.13 | 3.00 | 1.58 | 1.56 | 2.12 | 1.41 | 1.58 | 1.53 | 1.19 | 2.04 |
| 2.13 | 4.00 | 1.91 | 1.76 | 2.44 | 1.53 | 1.91 | 1.73 | 1.31 | 2.36 |

Figure 18:
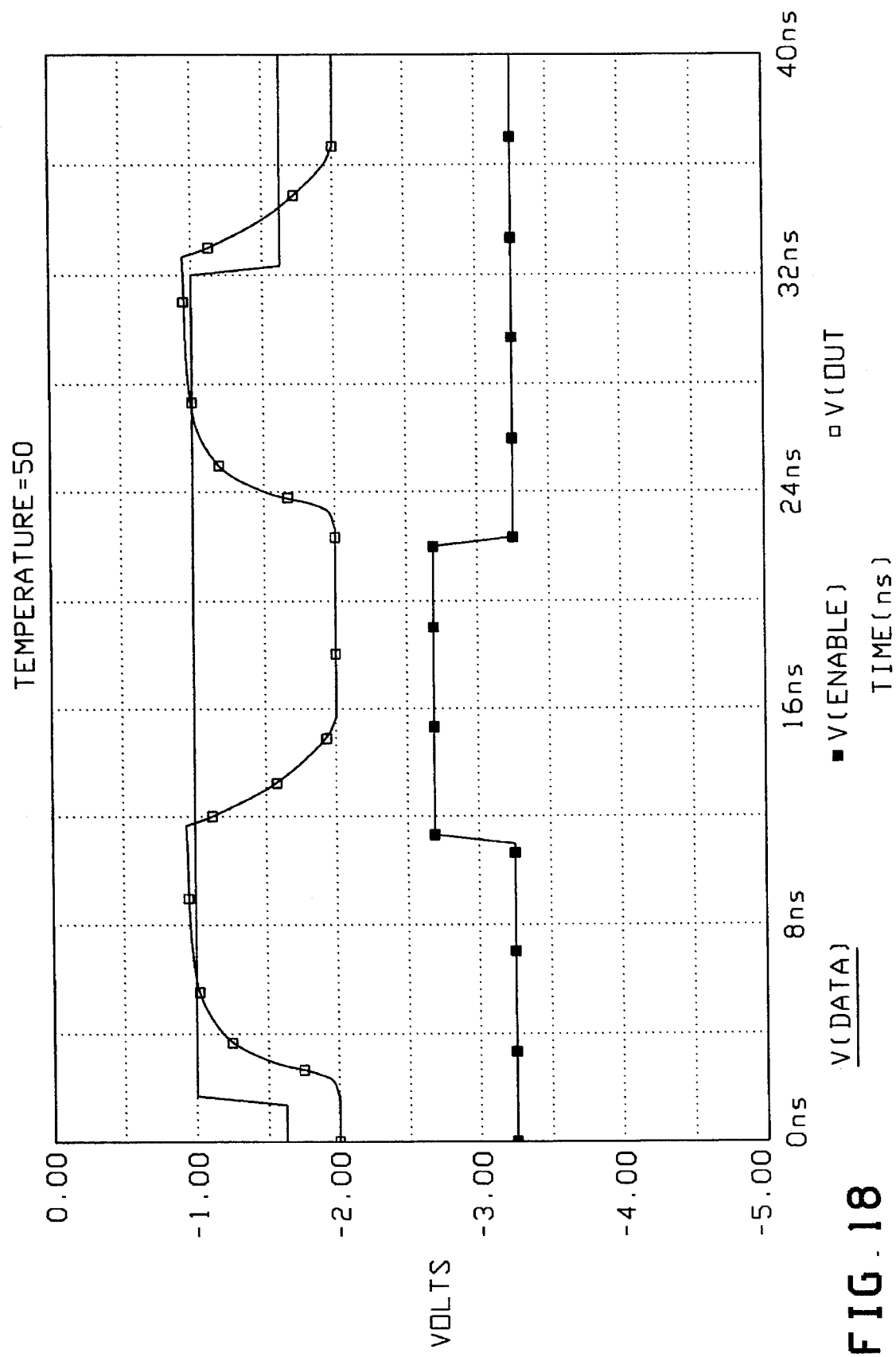
FIG. 18 is a waveform timing diagram for two input signals that can be applied to respective inputs of the driver of FIG. 16 and further showing an output signal produced by the driver of FIG. 16 in response to those input signals.

Results of a SPICE simulation of the driver 60 of FIG. 16 are shown in Table 5 and in FIG. 18. For the simulation used to generate Table 5 and FIG. 18, load resistors $RS_1$ and $RS_2$ are each set to 290 ohms, current source 68 is set to produce a constant current of 4.5 milliamperes, rise time TR and fall time TF are measured from 20% to 80%, and propagation delays TD are measured from 50% of the input to −1.3 volts on the output. When the ENABLE input is held constant, it is held at −3.3 volts. When the DATA input is held constant, it is held at −1.0 volts. As can be seen from the fourth thru seventh data rows of Table 5, when capacitor 84 is held constant, driver 60 output rise time TR, and propagation delay TD−+, are held constant notwithstanding variation in the value of capacitor 82. As can be seen from Table 5, capacitor 84 sets the driver 60 rise time, and selection of the capacitances of capacitor 82 and capacitor 84 can determine both driver output rise time and driver output fall time. Thus, a relatively independent adjustment of both the output rise time and the output fall time is provided by the apparatus of FIGS. 16 and 17. Such apparatus can, if desired, provide equal rise and fall times for the output of driver 60. Furthermore, as seen in FIG. 18, the 1.5 times multiple of output rise time versus output fall time of driver 10 is avoided by driver 60.

FIG. 19 and FIG. 22 show two other embodiments of a series-gated ECL driver of the present invention, to provide the user with some flexibility in his implementation due to any processing limitations and/or die layout.

Figure 20:
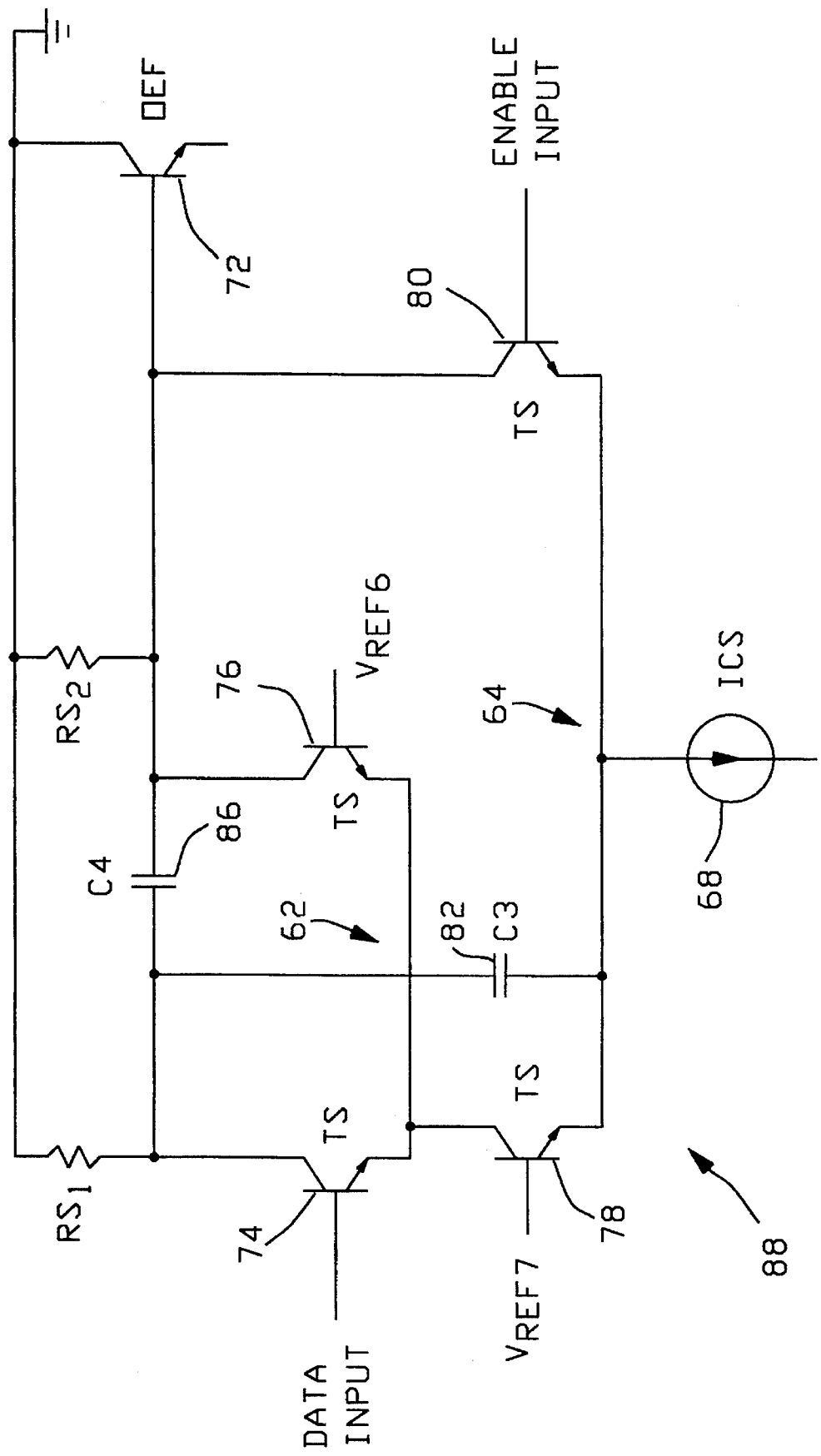
FIG. 20 is a simplified schematic diagram of the driver of FIG. 19.
Figure 21:
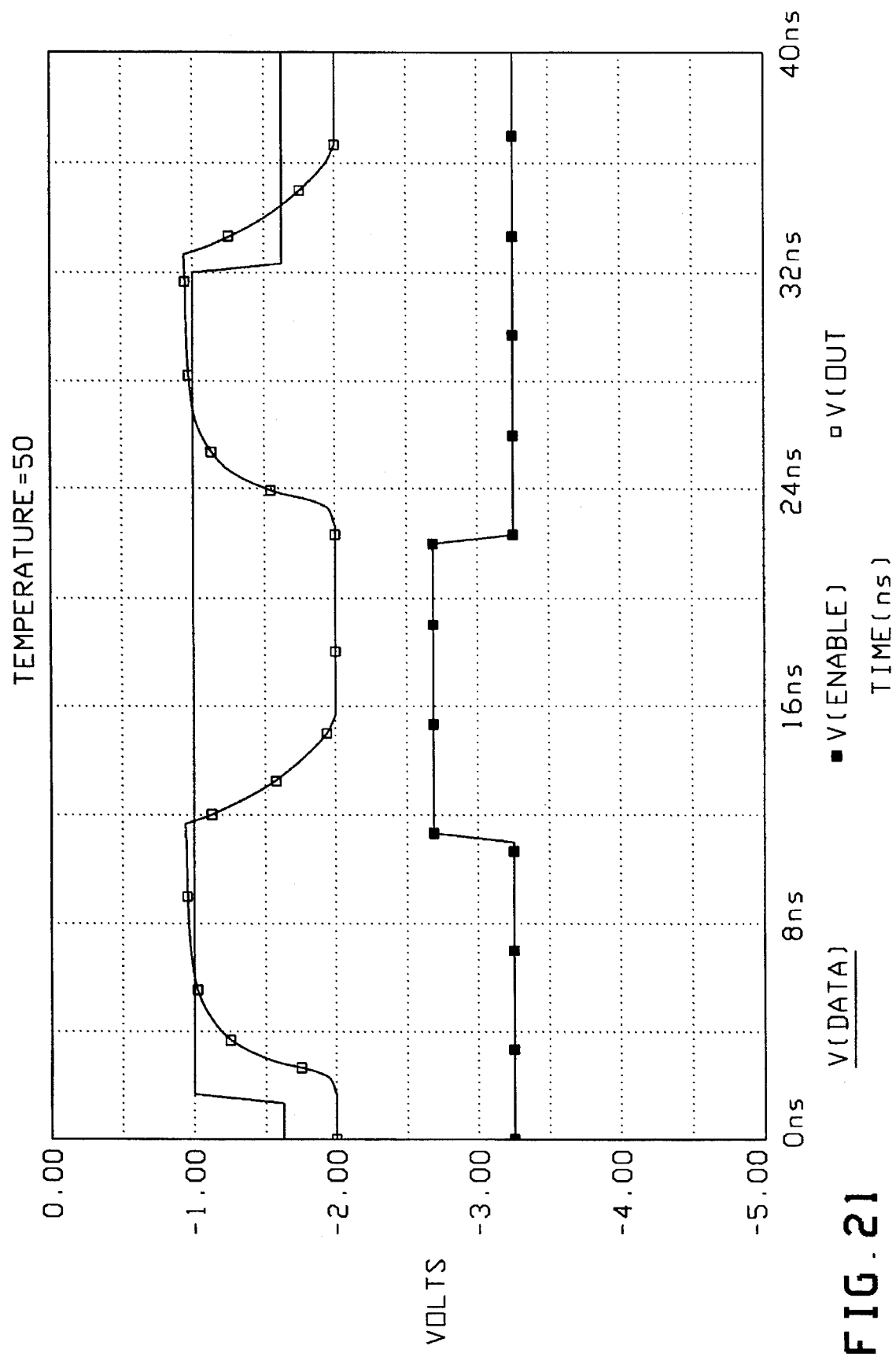
FIG. 21 is a waveform timing diagram for two input signals that can be applied to respective inputs of the driver of FIG. 19 and further showing an output signal produced by the driver of FIG. 19 in response to those input signals.
Figure 25:
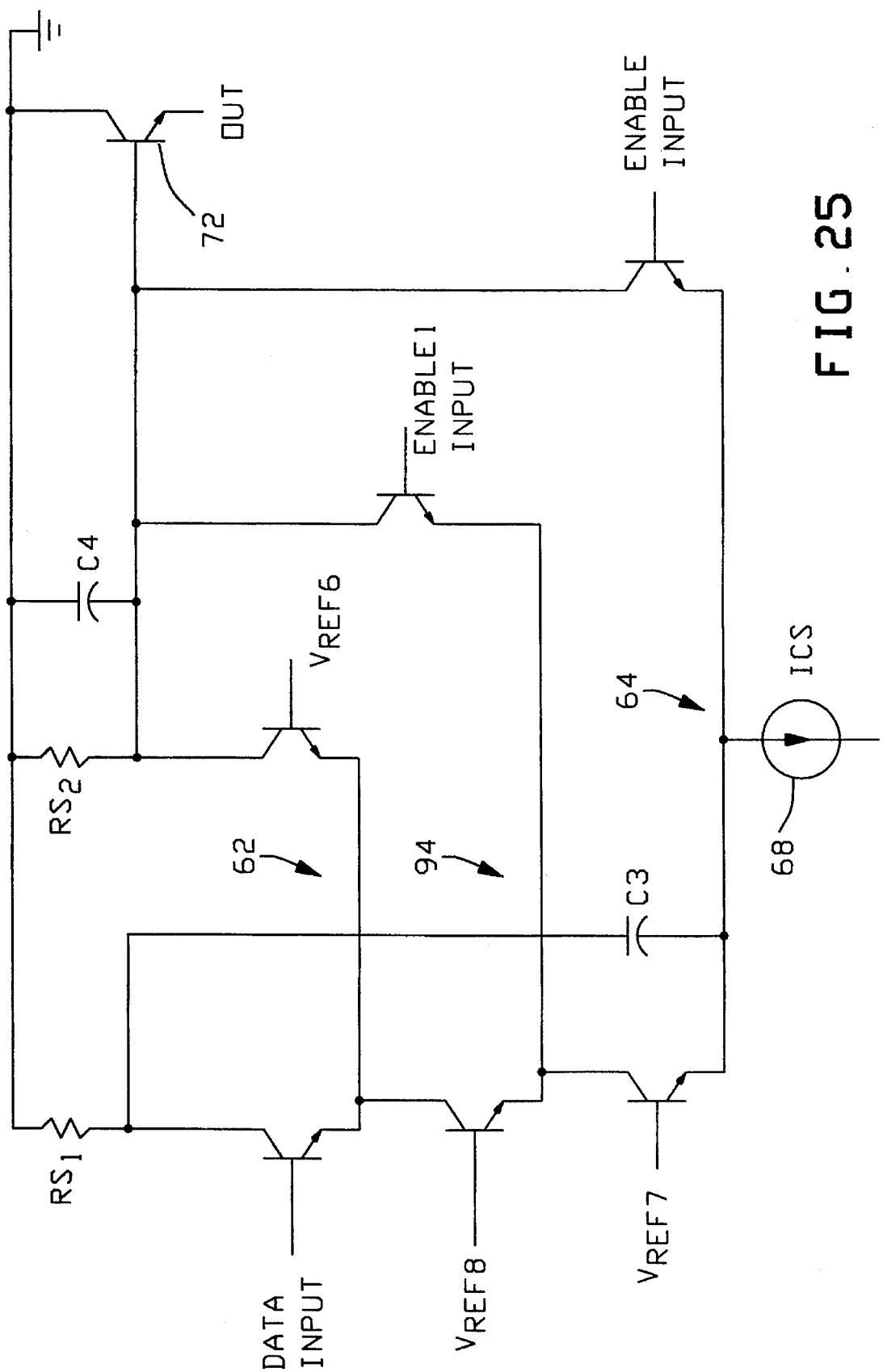
FIG. 25 is a schematic diagram of still another embodiment of a multi-level or series-gated ECL driver according to the present invention.
Figure 26:
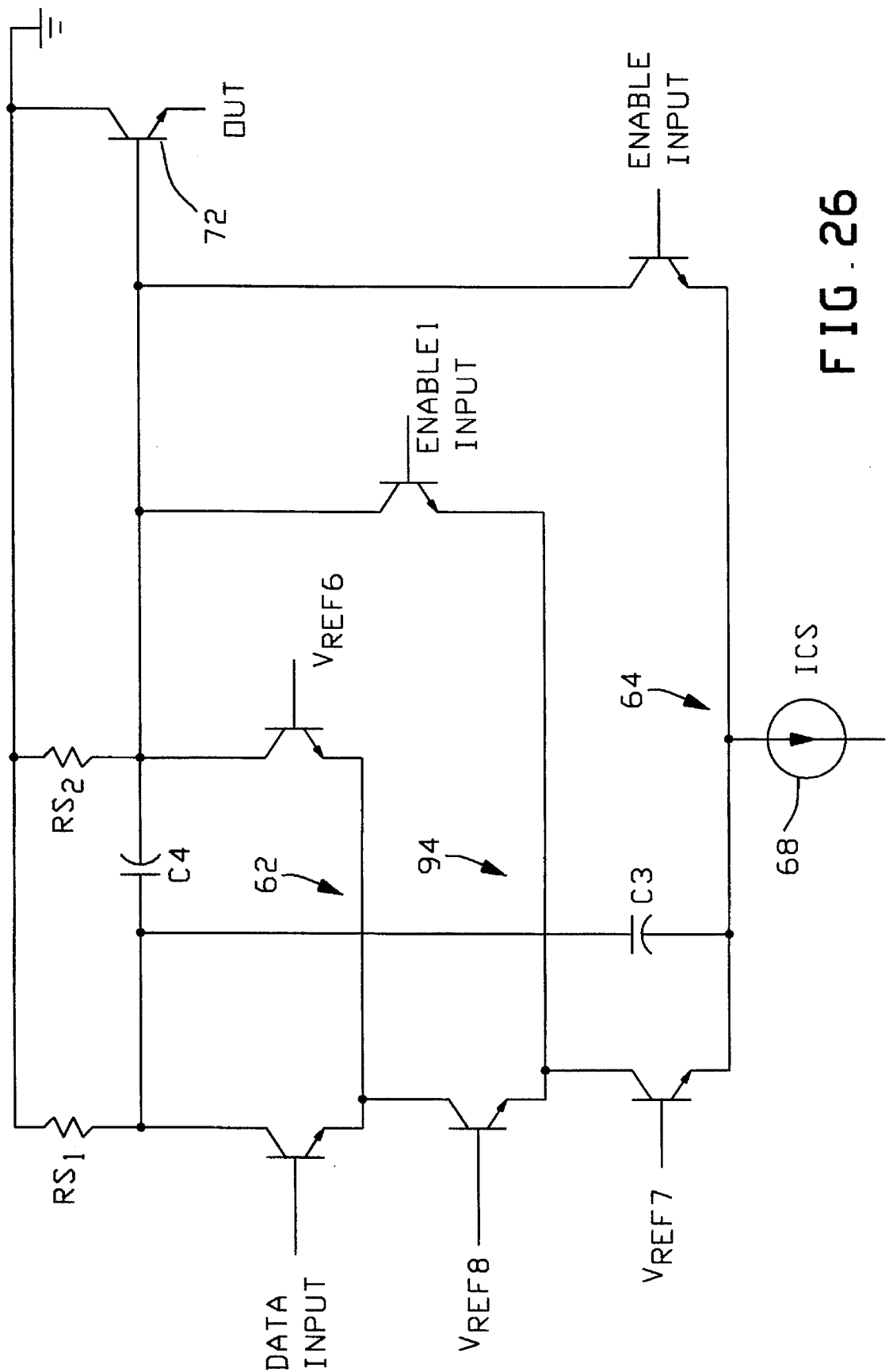
FIG. 26 is a schematic diagram of a further embodiment of a multi-level or series-gated ECL driver according to the present invention.

FIG. 19 is a schematic diagram of another embodiment of a multi-level or series-gated ECL cut-off driver according to the present invention which is similar to that of FIG. 16 except that capacitors C3 and C4 are differently connected. As shown in FIG. 19, capacitor 84 has been deleted, and instead capacitor 86 has been added as capacitor C4. Capacitor C4 is placed between the low side of both "swing" resistors $RS_1$ and $RS_2$ and thus is connected between the collector(s) of the transistor(s) of NOR side 74, and the collector(s) of the transistor(s) of OR side 76 (and thus the base(s) of the transistor(s) of OEF 72). Each of NOR side 74, OR side 76, NOR side 78, OR side 80, current source 68, input buffer 70 and output emitter follower (OEF) 72 can have one or more transistors; a single transistor for each is illustrated in FIGS. 17, 20 and 26 (and in FIGS. 25–27) for convenience and for simplicity of illustration. Results of a SPICE simulation of the driver 88 of FIG. 19 are shown in FIG. 21, and in Table 6 below. For this simulation, the electric current settings, voltage settings, component settings, definition of parameters, input, output loading, and measurement of parameters are as described above for FIG. 18 and Table 5.

With driver 60 of FIG. 16, and driver 90 of FIG. 22, the rise and fall times of the driver output can be made equal, or can be adjusted to fit the need while maintaining a propagation delay TD++ which increases only by an amount equal to the desired increase in fall time TF.

Particularly comparing Table 0 and Table 6, the driver 88 of FIG. 19 requires only about two-thirds the capacitance of driver 10 of FIG. 1 for the same fall time TF. Also, the propagation delay TD++ increases only by approximately delta TF, or the corresponding change in fall time TF. Also, when the capacitances C3 and C4 are equal, then for all practical purposes rise time TR equals fall time TF.

In driver 10 of FIG. 1, the capacitance C of capacitor 26 is obtained by using junction capacitance of a P-N junction that is always reverse biased. In driver 88 of FIG. 19, C4 capacitor 86 must be of the "parallel plate" variety since the polarity of the voltage across it changes, and so its constant reverse biasing cannot be guaranteed. The total required capacitance of driver 88 requires less than the area required for capacitor 26 of driver 10 of FIG. 1, to provide a corresponding fall time. With the driver 88 of FIG. 19, the user can obtain his or her desired transition time or times, and obtain better signal edges, using less capacitance, and less silicon area, than would be the case for the driver of FIG. 1.

As can be seen from Table 6, C4 capacitor 86, like C4 capacitor 84 of FIGS. 16 and 17, sets the driver output rise time, while the fall time can be set by the value of capacitor 82 and the value of capacitor 86 together. However, unlike the situation with driver 60 of FIGS. 16 and 17, C4 capacitor 86 cannot be a junction capacitor for reasons given above. Also, both driver 60 and driver 88 provide maximum propagation delay TD++. To avoid this last shortcoming, but

TABLE 6

| | | DATA INPUT | | | | ENABLE INPUT | | | |
|---|---|---|---|---|---|---|---|---|---|
| C3 | C4 | TR | TF | TD++ | TD— | TR | TF | TD+— | TD—+ |
| 1.00 | 1.00 | 1.19 | 1.17 | 1.79 | 1.07 | 1.23 | 1.20 | 0.90 | 1.75 |
| 2.00 | 2.00 | 1.84 | 1.90 | 2.44 | 1.36 | 1.88 | 1.94 | 1.14 | 2.36 |
| 3.00 | 3.00 | 2.57 | 2.70 | 3.11 | 1.62 | 2.61 | 2.74 | 1.34 | 3.00 |
| 1.00 | 1.45 | 1.47 | 1.36 | 2.07 | 1.17 | 1.50 | 1.41 | 1.00 | 2.04 |
| 1.50 | 1.45 | 1.47 | 1.50 | 2.08 | 1.21 | 1.51 | 1.54 | 1.02 | 2.02 |
| 2.00 | 1.45 | 1.47 | 1.63 | 2.08 | 1.26 | 1.52 | 1.67 | 1.03 | 2.01 |
| 1.45 | 1.00 | 1.20 | 1.28 | 1.80 | 1.12 | 1.24 | 1.31 | 0.92 | 1.74 |
| 1.45 | 1.50 | 1.50 | 1.51 | 2.11 | 1.22 | 1.54 | 1.55 | 1.02 | 2.06 |
| 1.45 | 2.00 | 1.84 | 1.75 | 2.43 | 1.31 | 1.87 | 1.79 | 1.12 | 2.37 |

As seen in FIG. 21, the 1.5 times multiple of output rise time versus output fall time for driver 10 is avoided by driver 88.

Figure 24:
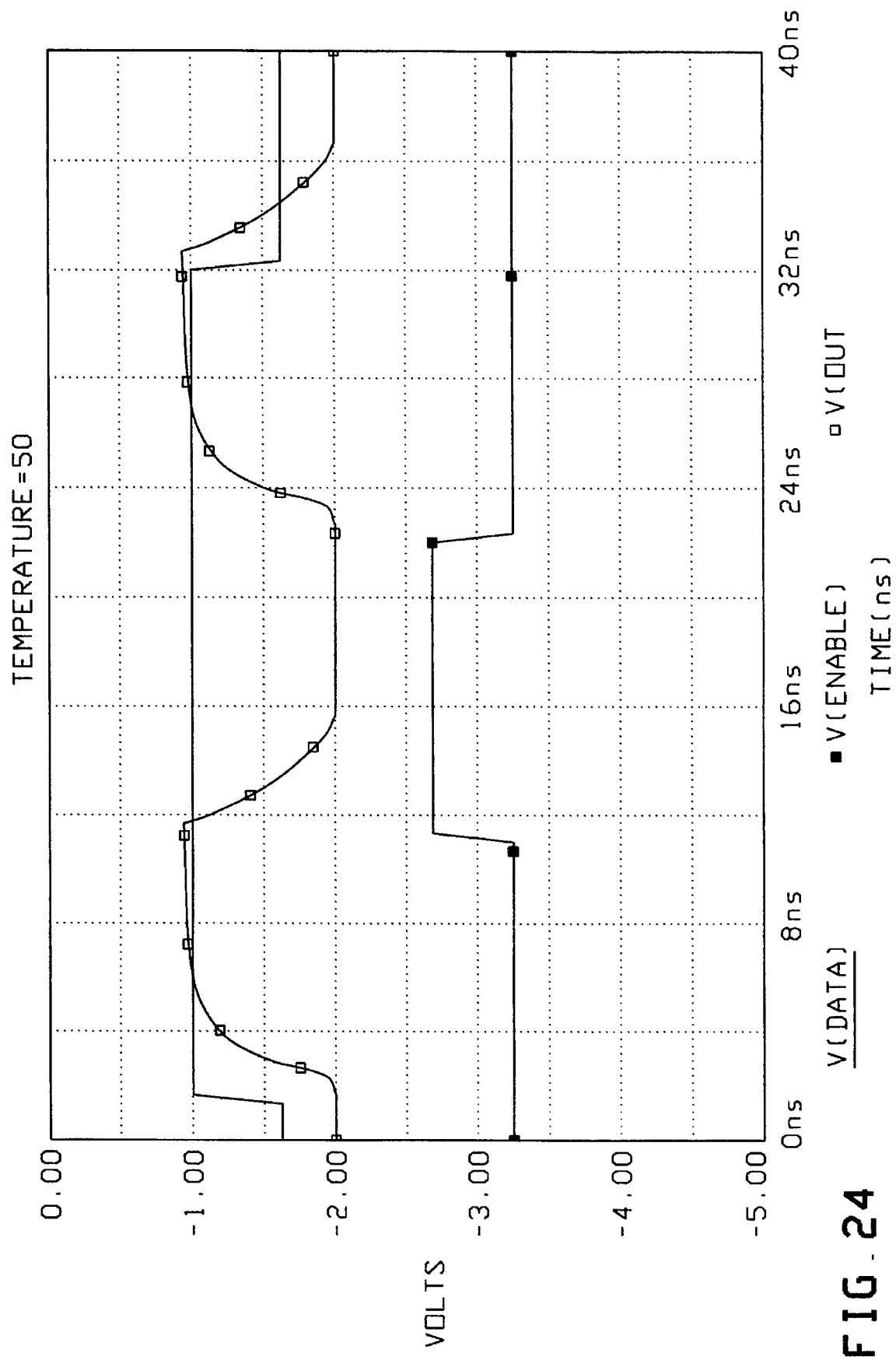
FIG. 24 is a waveform timing diagram for two input signals that can be applied to respective inputs of the driver of FIG. 22 and further showing an output signal produced by the driver of FIG. 22 in response to those input signals.

As can be seen in Table 6, for the driver 88 of FIGS. 19 and 20 the desired output rise time TR can be made equal to the desired output fall time TF, thus increasing the propagation delay TD++, TD—, TD+—, and TD—+ only by the increase of the fall time TF, so that a faster driver (compared with driver 10 of FIG. 1) is thereby provided. For the same output fall time, C3 plus C4 (the capacitance of capacitors 82 and 86) for FIGS. 19 and 20 is less than C (the capacitance of capacitor 26) for FIG. 1. With the configuration of FIG. 19, the rise and fall times of the output of driver 88 can be made equal, or can be adjusted to fit the need while maintaining propagation delays TD++, TD—, TD+—, and TD—+ which increase only by an amount equal to the desired increase in fall time TF.

at the expense of higher capacitance, driver 90 of FIG. 22 could be substituted for driver 60 or driver 88. Driver 90 of FIG. 22 is also desirable in that both C3 capacitor 82 and C4 capacitor 92 can each be junction capacitors, and in that C4 capacitor 92 independently sets driver 90 output rise time while C3 capacitor 82 independently sets driver 90 output fall time, as shown in Table 7 below. Results of a SPICE simulation of the driver 90 of FIG. 22 are given in FIG. 24, and in Table 7 below. For this simulation, the current, voltage and component settings, definition of parameters, input, output loading, and measurement of parameters are as described above for Tables 5 and 6, and for FIGS. 18 and 21. As can be seen in Table 7, when C4 capacitor 92 is varied while the value of C3 capacitor 82 is held constant at 4.61 picofarads, output fall time is essentially held constant. As can also be seen in Table 7, when the value of C3 capacitor 82 is varied while the value of C4 capacitor 92 is held constant at 3.00 picofarads, rise time is essentially constant.

TABLE 7

| | | DATA INPUT | | | | ENABLE INPUT | | | |
|---|---|---|---|---|---|---|---|---|---|
| C3 | C4 | TR | TF | TD++ | TD— | TR | TF | TD+— | TD—+ |
| 2.00 | 2.00 | 1.27 | 0.96 | 1.75 | 0.99 | 1.26 | 0.96 | 0.78 | 1.71 |
| 4.00 | 4.00 | 1.92 | 1.44 | 2.39 | 1.21 | 1.90 | 1.36 | 0.90 | 2.44 |
| 6.00 | 6.00 | 2.61 | 1.94 | 3.05 | 1.40 | 2.59 | 1.82 | 0.99 | 3.21 |
| 4.61 | 2.50 | 1.38 | 1.62 | 1.89 | 1.23 | 1.37 | 1.55 | 0.89 | 1.87 |
| 4.61 | 3.00 | 1.55 | 1.62 | 2.05 | 1.24 | 1.53 | 1.54 | 0.90 | 2.05 |
| 4.61 | 3.50 | 1.73 | 1.61 | 2.21 | 1.25 | 1.70 | 1.53 | 0.91 | 2.23 |
| 4.00 | 3.00 | 1.57 | 1.45 | 2.06 | 1.19 | 1.54 | 1.40 | 0.88 | 2.06 |
| 4.50 | 3.00 | 1.56 | 1.59 | 2.05 | 1.23 | 1.53 | 1.52 | 0.90 | 2.05 |
| 5.00 | 3.00 | 1.55 | 1.73 | 2.05 | 1.27 | 1.52 | 1.63 | 0.91 | 2.05 |

In comparing the respective drivers of FIG. 16, FIG. 19 and FIG. 22, the following observations can be made. Driver 60 of FIG. 16 uses the least capacitance, driver 88 of FIG. 19 uses average capacitance, and driver 90 of FIG. 22 uses the most capacitance. For all three drivers, capacitor C3 alone sets the output rise time. For driver 88 of FIG. 19, capacitor C4 cannot be a junction capacitor because its reverse-biasing cannot be assured; this is not so for driver 60 of FIG. 16 nor for driver 90 of FIG. 22, nor for capacitor C3 in any of those three drivers. In driver 60 of FIG. 16 and driver 88 of FIG. 19, the combination of capacitor C3 and capacitor C4 together determine the output fall time, while with driver 90 of FIG. 22 capacitor C3 alone sets the driver output fall time.

In the present invention, equal rise and fall times are preferred, to reduce delay.

In the present invention, a junction capacitor can be provided by a transistor having two leads (such as the base and emitter, or the collector and emitter) tied together; the junction capacitance of the resulting device can then be used as capacitor C3 or capacitor C4. If needed, two or more such transistors can be connected in parallel, to provide the desired capacitance.

Figure 27:
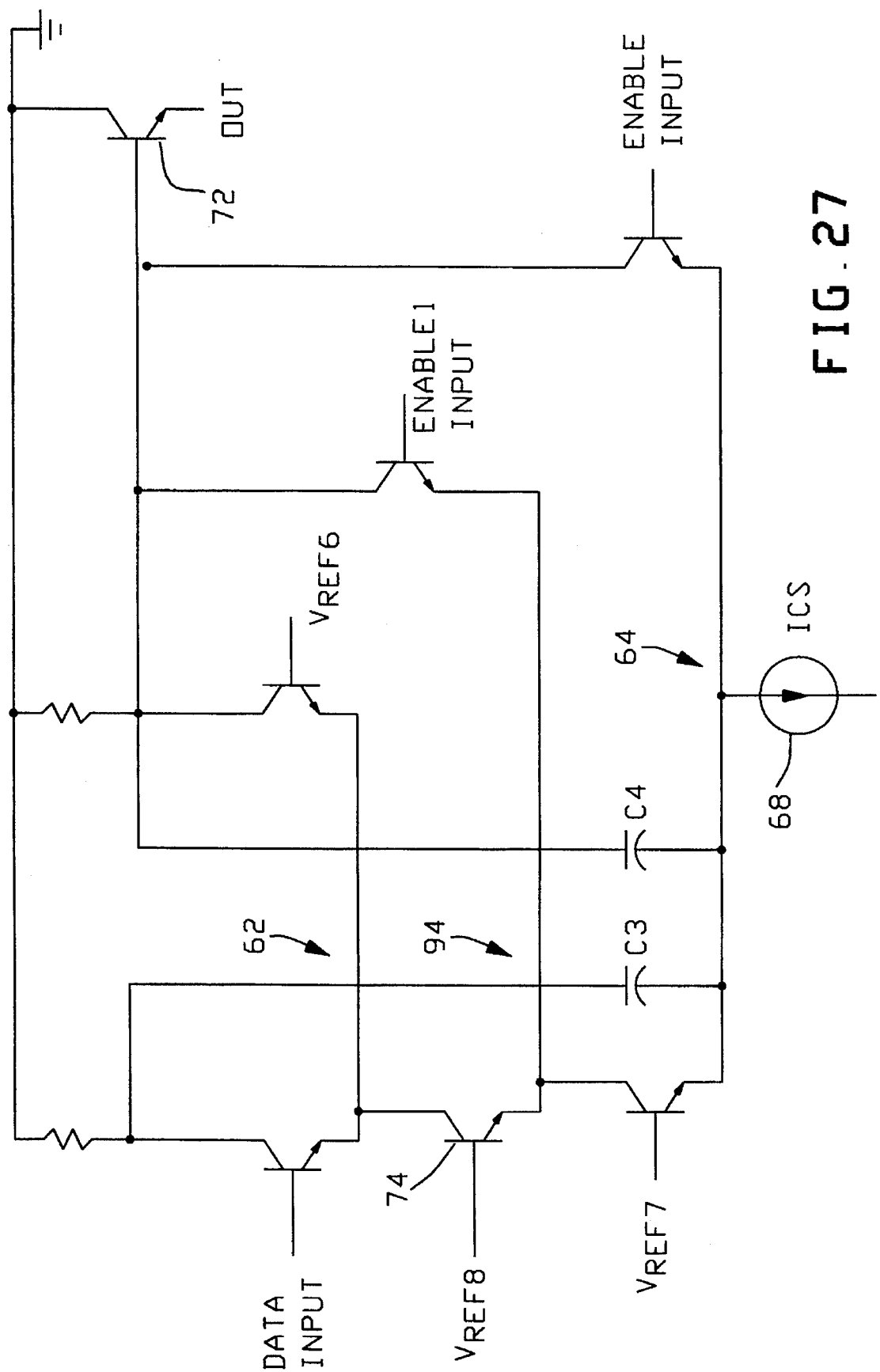
FIG. 27 is a schematic diagram of a still further embodiment of a multi-level or series-gated ECL driver according to the present invention.

It should be understood that the number of transistors used in any portion of the present invention can be varied as needed. For example, each transistor of FIG. 17, FIG. 20 and FIG. 23 can each be considered to represent a single transistor or a plurality of transistors. Also, in each of FIGS. 16, 17, 19, 20, 22 and 23, two current switches are shown, but in each case three or more current switches could be used in a single such driver. Three examples of three current switches used in a single driver according to the present invention are shown in FIGS. 25, 26 and 27. As discussed above, a series-gated ECL driver has an advantage over a non-series gated ECL driver in that a separate control input to enable or disable passthrough of the data input. For the respective ECL drivers of FIGS. 25, 26 and 27, two such enable inputs are provided; for each such driver, both such enable inputs have to be at the appropriate or active levels for the data input to appear at the output of the driver. Also, where a single capacitor is shown in FIGS. 16, 17, 19, 20, 22 and 23, a plurality of capacitors could be connected in parallel to provide the desired total capacitance for capacitor C3 or capacitor C4.

The component and signal values given above for the respective SPICE simulations of drivers 60, 88 and 90 are for ECL cutoff drivers. However, the present invention provides similar results with non-cutoff drivers. Non-cutoff series-gated ECL drivers according to the present invention have the same schematic diagrams (including but not limited to connection of capacitors C3 and C4) as those of FIGS. 16, 17, 19, 20, 22 and 23. For a non-cutoff driver, resistors $RS_1$ and $RS_2$ could each be 330 ohms, and current source 68 could generate a constant current of 3.0 milliamperes. Other values, for non-cutoff drivers as well as cutoff drivers, should be readily apparent to those of ordinary skill in the art, and would fall within the practice of the present invention.

Although drivers 60, 88 and 90 are each designed for implementation in a silicon integrated circuit, the present invention can be practiced with other materials, realizations and implementations, such as breadboarding or printed circuits.

Some of the many advantages of the present invention should now be readily apparent. For example, novel apparatus and method for controlling rise and fall times for the output of an ECL driver have been provided which are capable of reducing output signal reflections, and noise at the output of the driver, while limiting the delay resulting from such noise reduction. Such an ECL driver has also been provided. Such apparatus, method and driver are capable of adjustably controlling the rise and fall times of the ECL driver output at least substantially independently of each other, such that the rise time and fall time of the driver output can be made at least substantially equal. An ECL driver has also been provided having at least substantially separately adjustable output rise time and output fall time, thereby reducing any noise caused by the output while limiting or reducing the delay caused by such noise reduction.

Furthermore, novel apparatus and method for controlling rise and fall times for the output of a series-gated ECL driver have been provided which are capable of reducing output signal reflections, and noise at the output of the driver, while limiting the delay resulting from such noise reduction. Such a series-gated ECL driver has also been provided. Such apparatus, method and driver are capable of adjustably controlling the rise and fall times of the series-gated ECL driver output at least substantially independently of each other, such that the rise time and the fall time of the driver output can be made at least substantially equal. A series-gated ECL driver has also been provided having at least substantially separately adjustable output rise time and output fall time, thereby reducing any noise caused by the output while limiting or reducing the delay caused by such noise reduction. Because such capabilities have now been provided for a series-gated ECL driver, an ECL driver having these capabilities has thereby been provided which has at least one separate control input to separately control whether data input to such a driver is to be passed through to the output of the driver.

Obviously, many modifications and variations of the present invention are possible in light of the above teachings. It is therefore to be understood that the foregoing embodiments are presented by way of example only and that, within the scope of the appended claims and equivalents thereto, the invention may be practiced otherwise than as specifically described.

What is claimed is:

1. A driver, comprising:

current source means, having at least first and second electrodes, for producing electric current having a predetermined amplitude;

a first active electronic device having at least first, second and third electrodes;

a first resistor having at least first and second electrodes, wherein said first electrode of said first resistor is operably connected to said second electrode of said first device;

a second active electronic device having at least first, second and third electrodes;

a second resistor having at least first and second electrodes, wherein said first electrode of said second resistor is electrically connected to said second electrode of said second device, and wherein said second electrode of said second resistor is electrically connected to said second electrode of said first resistor;

a third active electronic device having at least first, second and third electrodes, wherein said first electrode of said third device is electrically connected to said first electrode of said current source means, and said first electrode of said first device and said first electrode of said second device are electrically connected to said second electrode of said third device;

a fourth active electronic device having at least first, second and third electrodes, wherein said first electrode of said fourth device is electrically connected to said first electrode of said current source means, and said second electrode of said fourth device is connected to said second electrode of said second device;

a first capacitor having at least first and second electrodes, wherein said first electrode of said first capacitor is electrically connected to said second electrode of said first device, and wherein said second electrode of said first capacitor is electrically connected to said first electrode of said current source means; and a second capacitor having at least first and second electrodes, wherein said first electrode of said second capacitor is electrically connected to said second electrode of said second device.

2. A driver as recited in claim 1 wherein said second electrode of said second capacitor is electrically connected to said second electrode of said second resistor.

3. A driver as recited in claim 1 wherein said second electrode of said second capacitor is electrically connected to said second electrode of said first device.

4. A driver as recited in claim 1 wherein said second electrode of said second capacitor is electrically connected to said first electrode of said current source means.

5. A driver as recited in claim 1, further comprising a fifth active electronic device having at least first, second and third electrodes, wherein said second electrode of said fifth device is electrically connected to said second electrode of said second resistor, and wherein said third electrode of said fifth device is electrically connected to said second electrode of said second device.

6. A driver as recited in claim 5 wherein said second electrode of said second capacitor is electrically connected to said second electrode of said fifth device.

7. A driver as recited in claim 5 wherein said second electrode of said second capacitor is electrically connected to said second electrode of said first device.

8. A driver is recited in claim 5 wherein said second electrode of said second capacitor is electrically connected to said first electrode of said second device.

9. A driver as recited in claim 5 wherein:

said first active electronic device comprises a first plurality of transistors each having at least first, second and third electrodes, wherein said first electrodes of said first plurality are electrically connected, and wherein said second electrodes of said first plurality are electrically connected;

said second active electronic device comprises a second plurality of transistors each having at least first, second and third electrodes, wherein said first electrodes of said second plurality are electrically connected, and wherein said second electrodes of said second plurality are electrically connected; and said fifth active electronic device comprises a third plurality of transistors each having at least first, second and third electrodes, wherein said first electrodes of said third plurality are electrically connected, and wherein said second electrodes of said third plurality are electrically connected.

10. A driver as recited in claim 5 wherein:

a first reference voltage can be applied to said third electrode of said second device.

11. A driver as recited in claim 5 wherein said second electrode of said fifth device is electrically connected to said second electrode of said current source means.

12. A driver as recited in claim 5 wherein:

said second electrode of said fifth device is electrically connected to a ground; and said second electrode of said current source means is electrically connected to the ground.

13. A driver as recited in claim 1 wherein said current source means comprises a voltage supply.

14. A driver as recited in claim 13 wherein:

said second electrode of said fifth device is electrically connected to said second electrode of said current source means;

said driver further comprises a third resistor having at least first and second electrodes;

said driver further comprises voltage source means, having at least first and second electrodes, for applying an electric voltage having a predetermined amplitude;

said first electrode of said third resistor is connected to said first electrode of said fifth device;

said first electrode of said voltage source means is connected to said second electrode of said third resistor;

said second electrode of said voltage source means is connected to ground;

an input signal can be applied to said third electrode of said first device; and in response to the input signal, said driver process an output signal at said first electrode of said fifth device.

15. A driver as recited in claim 5, further comprising an amplifier having an output connected to said third electrode of said first device, wherein said amplifier has an input.

16. A driver as recited in claim 15 wherein:

a first reference voltage can be applied to said third electrode of said second device;

a second reference voltage can be applied to said first electrode of said fifth device;

an input signal can be applied to said input of said amplifier; and in response to the input signal, said driver produces an output signal at said first electrode of said fifth device.

17. A driver as recited in claim 1 wherein:

a first reference voltage can be applied to said third electrode of said second device;

an input signal can be applied to said third electrode of said first device; and in response to the input signal, said driver produces an output signal at said second electrode of said second device.

18. A driver as recited in claim 17 wherein a second reference voltage can be applied to said second electrode of said second device.

* * * * *